US012568620B2

(12) United States Patent
Kim et al.

(10) Patent No.:  US 12,568,620 B2
(45) Date of Patent:       Mar. 3, 2026

(54) SEMICONDUCTOR DEVICE INCLUDING NITRIDE SPACERS

(71) Applicant: SAMSUNG ELECTRONICS CO., LTD., Suwon-si (KR)

(72) Inventors: Jeeyong Kim, Hanam-si (KR); Junghwan Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 829 days.

(21) Appl. No.: 17/680,413

(22) Filed: Feb. 25, 2022

(65) Prior Publication Data

US 2022/0310649 A1      Sep. 29, 2022

(30) Foreign Application Priority Data

Mar. 29, 2021    (KR) ........................ 10-2021-0040294

(51) Int. Cl.
  *H10B 43/27*        (2023.01)
  *H01L 25/10*        (2006.01)
      (Continued)

(52) U.S. Cl.
  CPC ............. *H10B 43/27* (2023.02); *H01L 25/18* (2013.01); *H10B 12/02* (2023.02); *H10B 41/27* (2023.02);
      (Continued)

(58) Field of Classification Search
  CPC ........ H10B 43/27; H10B 41/27; H10B 43/35; H10B 43/40; H10B 43/10; H10B 12/31;
      (Continued)

(56) References Cited

U.S. PATENT DOCUMENTS 9,373,628 B2    6/2016  Sohn et al.
9,406,617 B1 *  8/2016  Edelstein ............ H01L 23/5226
          (Continued)

FOREIGN PATENT DOCUMENTS

JP        2019-106535 A    6/2019
KR   10-2016-0087691 A    7/2016
          (Continued)

OTHER PUBLICATIONS

Borisenko, V.E., Hesketh, P.J., Rapid Thermal Processing of Semi-conductors, Springer, 193-252 (Year: 1997).*

(Continued)

*Primary Examiner* — Davienne N Monbleau
*Assistant Examiner* — Heim Kirin Grewal
(74) *Attorney, Agent, or Firm* — Fish & Richardson P.C.

(57)         ABSTRACT

A semiconductor device comprising: a substrate; an electrode structure disposed on the substrate while extending in a first direction, the electrode structure including a plurality of electrodes stacked in a second direction which is a vertical direction of the substrate; a bit line disposed on the electrode structure; vertical structures extending through the electrode structure in the second direction and contacting the substrate, each of the vertical structures including a vertical semiconductor pattern electrically connected to the bit line, and a data storage pattern surrounding a side wall of the vertical semiconductor pattern; common source plugs extending through the electrode structure in the second direction and contacting the substrate under a condition that the vertical structures are disposed among the common source plugs; and spacers respectively disposed to surround side walls of the common source plugs, each of the spacers including regions respectively having different nitride (N) concentrations.

17 Claims, 17 Drawing Sheets

(51) Int. Cl.

| | |
|---|---|
| *H01L 25/18* | (2023.01) |
| *H10B 12/00* | (2023.01) |
| *H10B 41/27* | (2023.01) |
| *H10B 43/30* | (2023.01) |
| *H10B 43/35* | (2023.01) |
| *H10B 43/40* | (2023.01) |

(52) U.S. Cl.
    CPC .............. *H10B 43/30* (2023.02); *H10B 43/35* (2023.02); *H01L 25/105* (2013.01); *H10B 43/40* (2023.02)

(58) Field of Classification Search
    CPC ........ H10B 12/39; H10B 12/02; H10B 43/20; H10B 43/03; H01L 25/18; H01L 25/105; H01L 23/5226; H01L 23/5283; H01L 21/823468; H01L 21/823475; H01L 21/02247; H01L 21/02249; H01L 21/02614
    See application file for complete search history.

(56) References Cited

U.S. PATENT DOCUMENTS

| | | | | |
|---|---|---|---|---|
| 9,443,861 | B1 * | 9/2016 | Pachamuthu | .......... H10B 43/27 |
| 9,595,535 | B1 * | 3/2017 | Ogawa | ................... H10B 43/50 |
| 9,666,525 | B2 * | 5/2017 | Kim | ...................... H01L 23/528 |
| 9,711,523 | B2 * | 7/2017 | Lee | ........................ H01L 21/0217 |
| 9,711,530 | B1 * | 7/2017 | Ikawa | ................. H01L 21/0217 |
| 9,773,806 | B1 * | 9/2017 | Lee | ................... G11C 16/0466 |
| 9,899,408 | B2 | 2/2018 | Son et al. | |
| 10,079,245 | B2 | 9/2018 | Han et al. | |
| 10,388,664 | B2 | 8/2019 | Huang et al. | |
| 10,411,089 | B2 | 9/2019 | Kim et al. | |
| 10,504,835 | B1 * | 12/2019 | Wang | ................ H01L 23/53238 |
| 10,796,952 | B1 | 10/2020 | Shen | |
| 2006/0284317 | A1 * | 12/2006 | Ito | ..................... H01L 21/76814 |
| | | | | 257/E21.585 |
| 2014/0220750 | A1 | 8/2014 | Sohn et al. | |
| 2015/0249093 | A1 | 9/2015 | Lee et al. | |
| 2016/0204111 | A1 | 7/2016 | Park et al. | |
| 2016/0314963 | A1 * | 10/2016 | Choi | ................. H01L 21/02236 |
| 2017/0053872 | A1 * | 2/2017 | Lee | ................... H01L 21/76879 |
| 2017/0053882 | A1 | 2/2017 | Jin et al. | |
| 2017/0062468 | A1 | 3/2017 | Son et al. | |
| 2017/0062470 | A1 | 3/2017 | Han et al. | |
| 2018/0269225 | A1 | 9/2018 | Huang et al. | |
| 2019/0013404 | A1 * | 1/2019 | Carlson | ............... H10D 30/693 |
| 2019/0172906 | A1 | 6/2019 | Kim et al. | |
| 2019/0333931 | A1 * | 10/2019 | Jung | ................... H10D 64/037 |
| 2020/0027894 | A1 * | 1/2020 | Son | ........................ H10B 43/27 |
| 2022/0123014 | A1 * | 4/2022 | Kim | ........................ H10B 43/40 |
| 2022/0344361 | A1 * | 10/2022 | Jeon | ........................ H10B 43/10 |
| 2023/0012115 | A1 * | 1/2023 | Kim | ........................ H10B 43/10 |

FOREIGN PATENT DOCUMENTS

| | | | | |
|---|---|---|---|---|
| KR | 10-2020-0078784 | A | 7/2020 | |
| KR | 102700932 | B1 * | 6/2021 | ............ H10B 43/40 |

OTHER PUBLICATIONS

Borisenko, V.E., Hesketh, P.J. (1997). Rapid Thermal Oxidation and Nitridation. In: Rapid Thermal Processing of Semiconductors. Microdevices. Springer, Boston, MA (hereinafter Borisenko). (Year: 1997).*

Office Action in Korean Appln. No. 10-2021-0040294, mailed on May 9, 2025, 9 pages (with English translation).

Notice of Allowance in Korean Appln. No. 10-2021-0040294, mailed on Dec. 30, 2025 (with English translation).

\* cited by examiner

SEMICONDUCTOR DEVICE INCLUDING NITRIDE SPACERS

CROSS-REFERENCE TO THE RELATED APPLICATION

This application claims priority from Korean Patent Application No. 10-2021-0040294, filed on Mar. 29, 2021, in the Korean Intellectual Property Office, the disclosure of which is incorporated herein by reference in its entirety.

BACKGROUND

1. Field

The exemplary embodiments of the disclosure relate to a semiconductor device including a nitride spacer. In particular, the exemplary embodiments of the disclosure relate to a non-volatile memory device including a nitride spacer, and a method for manufacturing the same.

2. Description of the Related Art

In order to satisfy excellent performance and a low price of a semiconductor device demanded by consumers, an increase in integration degree of the semiconductor device is required. In the case of a semiconductor device, the integration degree thereof is an important factor in determining the price of a product and, as such, an increased integration degree is particularly required. In the case of a two-dimensional or planar semiconductor device, the integration degree thereof is mainly determined by an area occupied by a unit memory cell and, as such, is greatly influenced by the level of micropattern formation technology. However, pieces of super-expensive equipment are needed for down-scaling of patterns. For this reason, although the integration degree of such a two-dimensional semiconductor device is increasing, the integration degree increase is still limited. To this end, three-dimensional semiconductor memory devices including three-dimensionally arranged memory cells are proposed. For example, research on methods for increasing the height of a cell in a semiconductor memory device is being conducted.

SUMMARY

The exemplary embodiments of the disclosure provide a semiconductor device manufacturing method capable of minimizing stress of a film quality in a high-temperature process, and a semiconductor device manufactured using the method.

In one embodiment of the inventive concept, a semiconductor device comprising: a substrate; an electrode structure disposed on the substrate while extending in a first direction, the electrode structure including a plurality of electrodes stacked in a second direction which is a vertical direction of the substrate; a bit line disposed on the electrode structure; vertical structures extending through the electrode structure in the second direction and contacting the substrate, each of the vertical structures including a vertical semiconductor pattern electrically connected to the bit line, and a data storage pattern surrounding a side wall of the vertical semiconductor pattern; common source plugs extending through the electrode structure in the second direction and contacting the substrate under a condition that the vertical structures are disposed among the common source plugs; and spacers respectively disposed to surround side walls of the common source plugs, each of the spacers including regions respectively having different nitride (N) concentrations.

In one embodiment of the inventive concept, a method for manufacturing a semiconductor device, comprising: forming a word line cut to extend through an electrode structure, which includes a plurality of electrodes formed on a substrate and stacked in a vertical direction, around a vertical structure extending through the electrode structure in the vertical direction, and to expose the substrate; forming a spacer at an inner wall of the word line cut and an exposed portion of the substrate to a predetermined thickness; performing a nitridation process at a surface of the spacer; performing an etch-back process at a bottom portion of the spacer such that the substrate is again exposed; and forming a common source plug filling the word line cut, wherein, through the nitridation process, the spacer is formed with a first nitride region disposed adjacent to the common source plug while having a nitride (N) concentration of b (%) to a (%) (a>b), a second nitride region surrounding the first nitride region while having a nitride (N) concentration of c (%) to b (%) (b>c), and a third nitride region surrounding the second nitride region while having a nitride N) concentration of d (%) to c (%) (c>d).

In one embodiment of the inventive concept, a semiconductor device comprising: a main substrate; and a controller, one or more semiconductor packages, and a DRAM which are mounted on the main substrate, wherein each of the semiconductor packages includes a package substrate, semiconductor chips disposed on the package substrate, a connection structure interconnecting the semiconductor chips, and a molding layer covering the semiconductor chips and the connection structure on the package substrate, wherein each of the semiconductor chips includes a substrate, an electrode structure disposed on the substrate while extending in a first direction, the electrode structure including a plurality of electrodes stacked in a second direction which is a vertical direction of the substrate, a bit line disposed on the electrode structure, vertical structures extending through the electrode structure in the second direction and contacting the substrate, each of the vertical structures including a vertical semiconductor pattern electrically connected to the bit line, and a data storage pattern surrounding a side wall of the vertical semiconductor pattern, common source plugs extending through the electrode structure in the second direction and contacting the substrate under a condition that the vertical structures are disposed among the common source plugs, and spacers respectively disposed to surround side walls of the common source plugs, each of the spacers including regions respectively having different nitride (N) concentrations, wherein each of the spacers includes a first nitride region disposed adjacent to a corresponding one of the common source plugs while having a nitride (N) concentration of b (%) to a (%) (a>b), a second nitride region surrounding the first nitride region while having a nitride (N) concentration of c (%) to b (%) (b>c), and a third nitride region surrounding the second nitride region while having a nitride N) concentration of d (%) to c (%) (c>d).

BRIEF DESCRIPTION OF THE DRAWINGS

FIGS. 3 and 4 are sectional views schematically showing semiconductor packages according to an exemplary embodiment of the disclosure.

FIG. 5 is a plan view showing a portion of a top surface of a semiconductor device according to an exemplary embodiment of the disclosure.

DETAILED DESCRIPTION OF EXEMPLARY EMBODIMENTS

Figure 1:
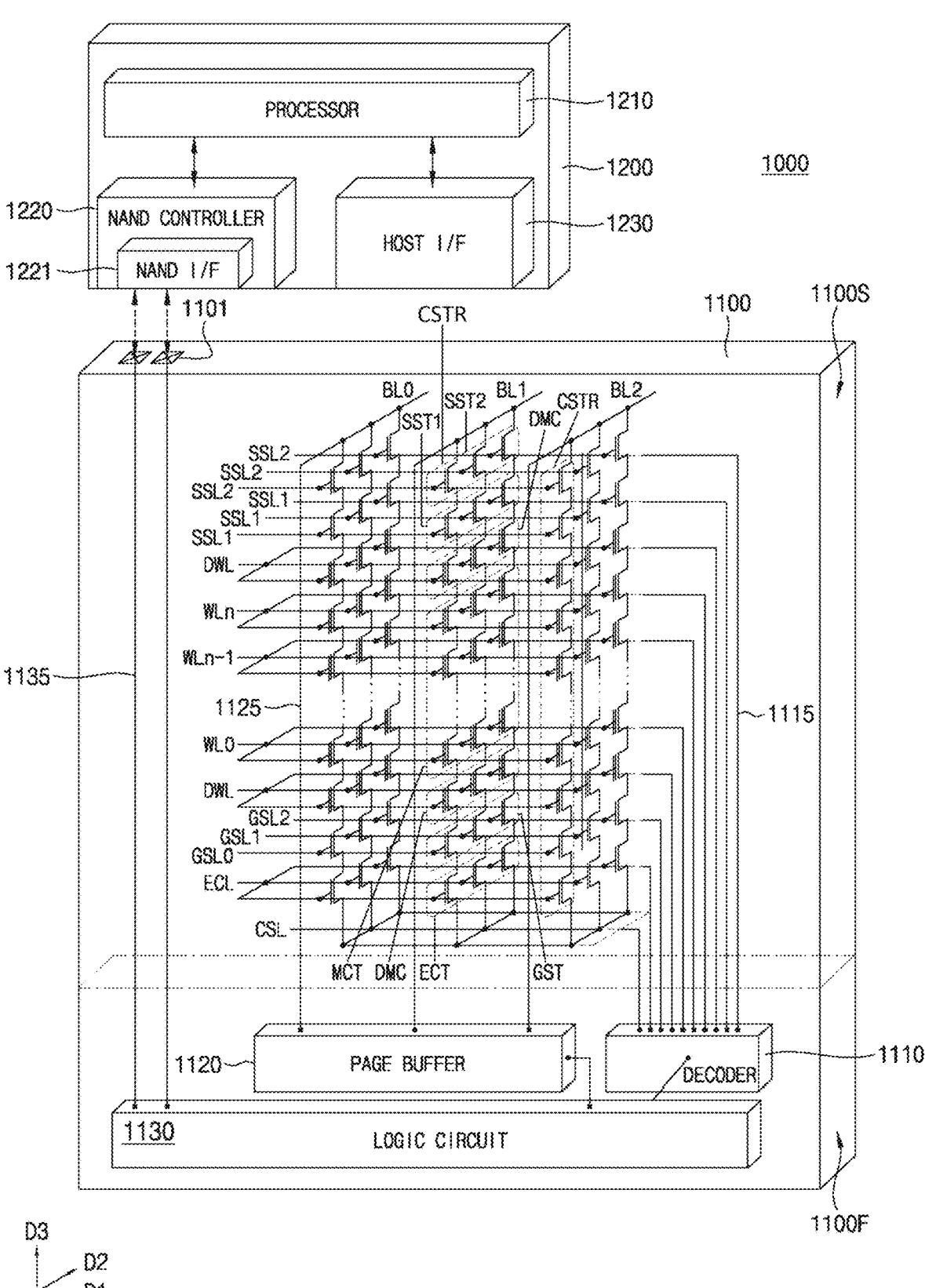
FIG. 1 is a view schematically showing an electronic system including a semiconductor device according to an exemplary embodiment of the disclosure.

FIG. 1 is a view schematically showing an electronic system including a semiconductor device according to an exemplary embodiment of the disclosure.

Referring to FIG. 1, an electronic system 1000 according to an exemplary embodiment of the disclosure may include a semiconductor device 1100, and a controller 1200 electrically connected to the semiconductor device 1100. The electronic system 1000 may be a storage device including one semiconductor device 1100 or a plurality of semiconductor devices 1100, or an electronic device including a storage device. For example, the electronic system 1000 may be a solid state drive (SSD) device, a universal serial bus (USB) thumb drive, a computing system, a medical device or a communication device which includes one semiconductor device 1100 or a plurality of semiconductor devices 1100.

The semiconductor device 1100 may be a non-volatile memory device. For example, the semiconductor device 1100 may be a NAND flash memory device. The semiconductor device 1100 may include a first structure 1110F, and a second structure 1100S on the first structure 1110F. In exemplary embodiments, the first structure 1110F may be disposed at one side of the second structure 1100S. The first structure 1110F may be a peripheral circuit structure including a decoder circuit 1110, a page buffer 1120 and a logic circuit 1130. The second structure 1100S may be a memory cell array structure including a common source line CSL, a plurality of bit lines BL0 to BL2, and cell strings CSTR between the common source line CSL and the bit lines BL0 to BL2.

The cell strings CSTR may be two-dimensionally arranged in first and second directions D1 and D2, and may extend in a third direction D3. The bit lines BL0 to BL2 may extend in the second direction D2, and may be spaced apart from one another in the first direction D1.

A plurality of cell strings CSTR may be connected in parallel to each of the bit lines BL0 to BL2. The plurality of cell strings CSTR may be connected in common to the common source line CSL. A plurality of cell strings CSTR may be disposed between the plurality of bit lines BL0 to BL2 and one common source line CSL. A plurality of common source lines CSL may be two-dimensionally arranged. In this case, electrically identical voltages may be applied to the common source lines CSL, respectively, or the common source lines CSL may be electrically controlled, respectively.

In an exemplary embodiment, each of the cell strings CSTR may be constituted by string selection transistors SST1 and SST2 connected in series, memory cell transistors MCT connected in series, a ground selection transistor GST, and an erase control transistor ECT. In addition, each of the memory cell transistors MCT may include a data storage element.

For example, each of the cell strings CSTR may include first and second string selection transistors SST1 and SST2, and the second string selection transistor SST2 may be connected to the bit lines BL0 to BL2. Alternatively, each of the cell strings CSTR may include one string selection transistor. In another example, the ground selection transistor GST in each of the cell strings CSTR may be constituted by a plurality of MOS transistors connected in series, similarly to the first and second string selection transistors SST1 and SST2.

One cell string CSTR may be constituted by a plurality of memory cell transistors MCT respectively having different distances from the common source lines CSL. The memory cell transistors MCT may be connected in series between the first string selection transistor SST1 and the ground selection transistor GST. The erase control transistor ECT may be connected between the ground selection transistor GST and the common source line CSL. In accordance with embodiments, each of the cell strings CSTR may include dummy cells DMC connected between the first string selection transistor SST1 and the memory cell transistor MCT and between the ground selection transistor GST and the memory cell transistor MCT.

In an exemplary embodiment, the first string selection transistor SST1 may be controlled by a first string selection line SSL1, and the second string selection transistor SST2 may be controlled by a second string selection line SSL2. The memory cell transistors MCT may be controlled by a plurality of word lines WL0 to WLn, respectively, and each of the dummy cells DMC may be controlled by a dummy word line DWL. The ground selection transistor GST may be controlled by a ground selection line GSL, and the erase control transistor ECT may be controlled by an erase control line ECL. The common source line CSL may be connected to sources of the erase control transistors ECT in common.

Gate electrodes of the memory cell transistors MCT disposed to be spaced apart from the common source lines CSL by substantially the same distance may be connected to one of the word lines WL0 to WLn and the dummy word line DWL in common and, as such, may be in an equipotential state. Otherwise, even when the gate electrodes of the memory cell transistors MCT are disposed at substantially the same level from the common source lines CSL, the gate electrodes, which are disposed in different rows or columns, may be independently controlled.

Ground selection lines GSL0 to GSL2, as well as the string selection lines SSL1 and SSL2, may extend in the first direction D1 while being spaced apart from one another in the second direction D2. The ground selection lines GSL0 to GSL2, as well as the string section lines SSL1 and SSL2, which are disposed at substantially the same level from the common source lines CSL, may be electrically isolated from one another. The erase control transistors ECT of different ones of the cell strings CSTR may be controlled by a common erase control line ECL. The erase control transistors ECT may generate gate-induced drain leakage (GIDL) during erase operation of a memory cell array associated therewith.

The common source line CSL, the erase control line ECL, the ground selection lines GSL0 to GSL2, the string selection lines SSL1 and SSL2, the dummy word line DWL, and the word lines WL0 to WLn may be electrically connected to the decoder circuit 1110 via first connecting lines 1115 extending from the inside of the first structure 1110F to the second structure 1100S. The bit lines BL0 to BL2 may be electrically connected to the page buffer 1120 via second connecting lines 1125 extending from the inside of the first structure 1110F to the second structure 1100S.

In the first structure 1110F, the decoder circuit 1110 and the page buffer 1120 may perform a control operation for a selection memory cell transistor of at least one of the plurality of memory cell transistors MCT. The decoder circuit 1110 and the page buffer 1120 may be controlled by the logic circuit 1130. The semiconductor device 1000 may communicate with the controller 1200 through an input/output pad 1101 electrically connected to the logic circuit 1130. The input/output pad 1101 may be electrically connected to the logic circuit 1130 via an input/output connecting line 1135 extending from the inside of the first structure 1110F to the second structure 1100S.

The controller 1200 may include a processor 1210, a NAND controller 1220, and a host interface 1230. In accordance with embodiments, the electronic system 1000 may include a plurality of semiconductor devices 1100. In this case, the controller 1200 may control the plurality of semiconductor devices 1100.

The processor 1210 may control overall operations of the electronic system 1000 including the controller 1200. The processor 1210 may operate in accordance with predetermined firmware, and may access the semiconductor device 1100 by controlling the NAND controller 1220. The NAND controller 1220 may include a NAND interface 1221 for processing communication with the semiconductor device 1100. A control command for controlling the semiconductor device 1100, data to be written in the memory cell transistors MCT of the semiconductor device 1100, data to be read out from the memory cell transistors MCT of the semiconductor device 1100, etc. may be transmitted through the NAND interface 1221. The host interface 1230 may provide a communication function between the electronic system 1000 and an external host. Upon receiving a control command from an external host via the host interface 1230, the processor 1210 may control the semiconductor device 1100 in response to the control command.

Figure 2:
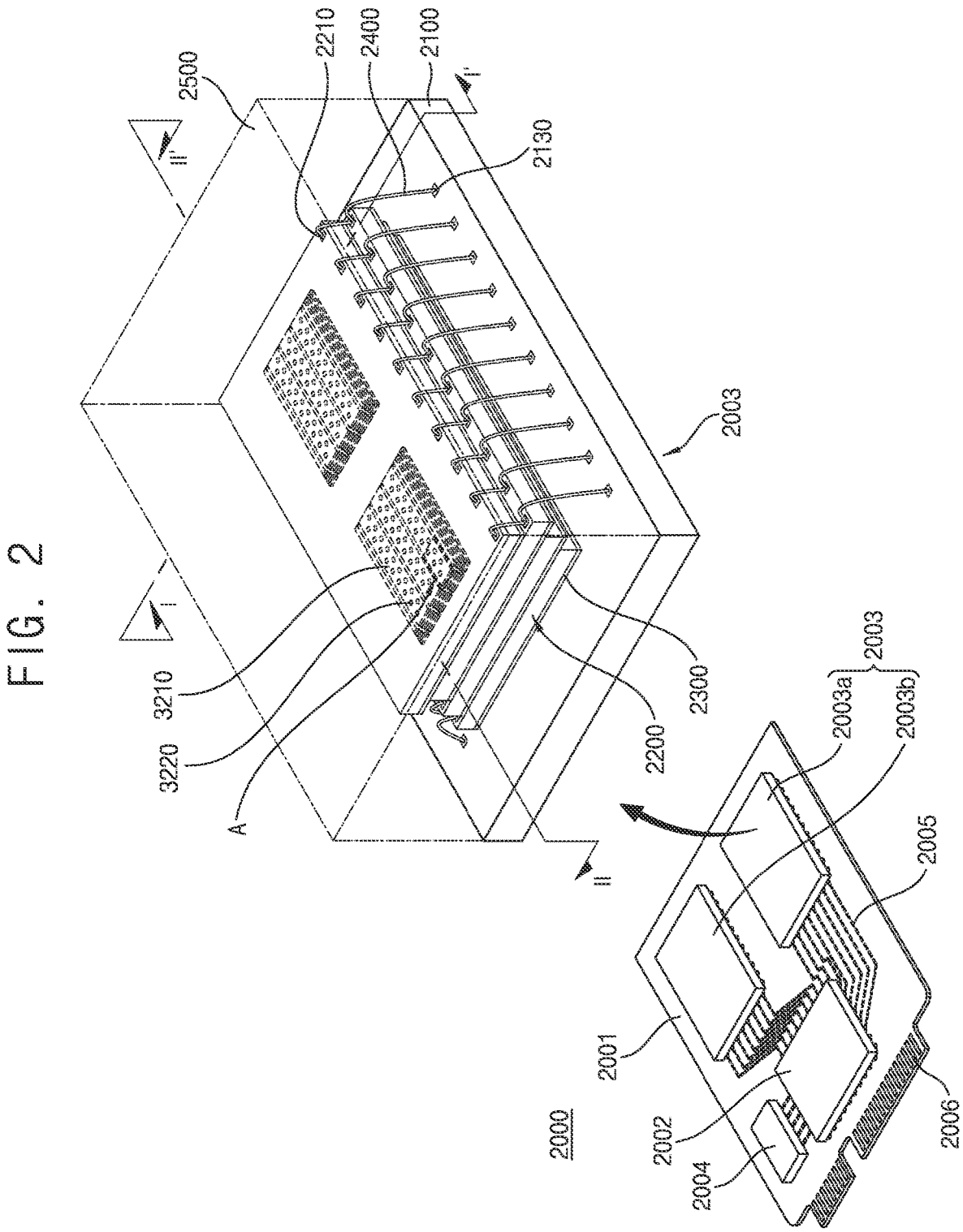
FIG. 2 is a perspective view schematically showing an electronic system including a semiconductor device according to an exemplary embodiment of the disclosure.

FIG. 2 is a perspective view schematically showing an electronic system including a semiconductor device according to an exemplary embodiment of the disclosure.

Referring to FIG. 2, an electronic system 2000 according to an exemplary embodiment of the disclosure may include a main substrate 2001, a controller 2002 mounted on the main substrate 2001, at least one semiconductor package 2003, and a DRAM 2004. The semiconductor package 2003 and the DRAM 2004 may be connected to the controller 2002 by wiring patterns 2005 formed on the main substrate 2001.

The main substrate 2001 may include a connector 2006 including a plurality of pins coupled to an external host. The number and arrangement of the plurality of pins in the connector 2006 may be varied in accordance with a communication interface between the electronic system 2000 and the external host. In an exemplary embodiment of the disclosure, the electronic system 2000 may communicate with the external host in accordance with any one of interfaces such as a universal serial bus (USB), peripheral component interconnect express (PCI-Express), serial advanced technology attachment (SATA), M-PHY for universal flash storage (UFS), etc. In an exemplary embodiment of the disclosure, the electronic system 2000 may operate by power supplied from the external host via the connector 2006. The electronic system 2000 may further include a power management integrated circuit (PMIC) for distributing power supplied from the external host to the controller 2002 and the semiconductor package 2003.

The controller 2002 may write data in the semiconductor package 2003 or may read out data from the semiconductor package 2003. The controller 2002 may also enhance an operation speed of the electronic system 2000.

The DRAM 2004 may be a buffer memory for reducing a speed difference between the semiconductor package 2003, which is a data storage space, and the external host. The DRAM 2004, which is included in the electronic system 2000, may also operate as a kind of cache memory. The DRAM 2004 may provide a space for temporarily storing data in a control operation for the semiconductor package 2003. When the DRAM 2004 is included in the electronic system 2000, the controller 2002 may further include a DRAM controller for controlling the DRAM 2004, in addition to the NAND controller for controlling the semiconductor package 2003.

The semiconductor package 2003 may include first and second semiconductor packages 2003a and 2003b spaced apart from each other. Each of the first and second semiconductor packages 2003a and 2003b may be a semiconductor package including a plurality of semiconductor chips 2200. Each of the first and second semiconductor packages 2003a and 2003b may include a package substrate 2100, semiconductor chips 2200 on the package substrate 2100, adhesive layers 2300 respectively disposed at bottom surfaces of the semiconductor chips 2200, a connecting structure 2400 for electrically interconnecting the semiconductor chips 2200 and the package substrate 2100, and a molding layer 2500 covering the semiconductor chips 2200 and the connecting structure 2400 on the package substrate 2100.

The package substrate 2100 may be a printed circuit board including package upper pads 2130. Each of the semiconductor chips 2200 may include an input/output pad 2210. The input/output pad 2210 may correspond to the input/output pad 1101 of FIG. 1. Each of the semiconductor chips 2200 may include gate stack structures 3210 and memory channel structures 3220.

In an exemplary embodiment, the connecting structure 2400 may be a bonding wire for electrically interconnecting the input/output pad 2210 and the package upper pads 2130. Accordingly, in each of the first and second semiconductor packages 2003a and 2003b, the semiconductor chips 2200 may be electrically interconnected through wire bonding, and may be electrically connected to the corresponding package upper pads 2130 of the package substrate 2100. In accordance with embodiments, in each of the first and second semiconductor packages 2003a and 2003b, the semiconductor chips 2200 may be electrically interconnected by a connecting structure including a through-silicon via (TSV) in place of the bonding wire type connecting structure 2400.

In an exemplary embodiment, the controller 2002 and the semiconductor chips 2200 may be included in one package. In an exemplary embodiment of the disclosure, the controller 2002 and the semiconductor chips 2200 may be mounted on a separate interposer substrate different from the main substrate 2001. In this case, the controller 2002 and the semiconductor chips 2200 may be interconnected by wirings formed at the interposer substrate.

Figure 3:
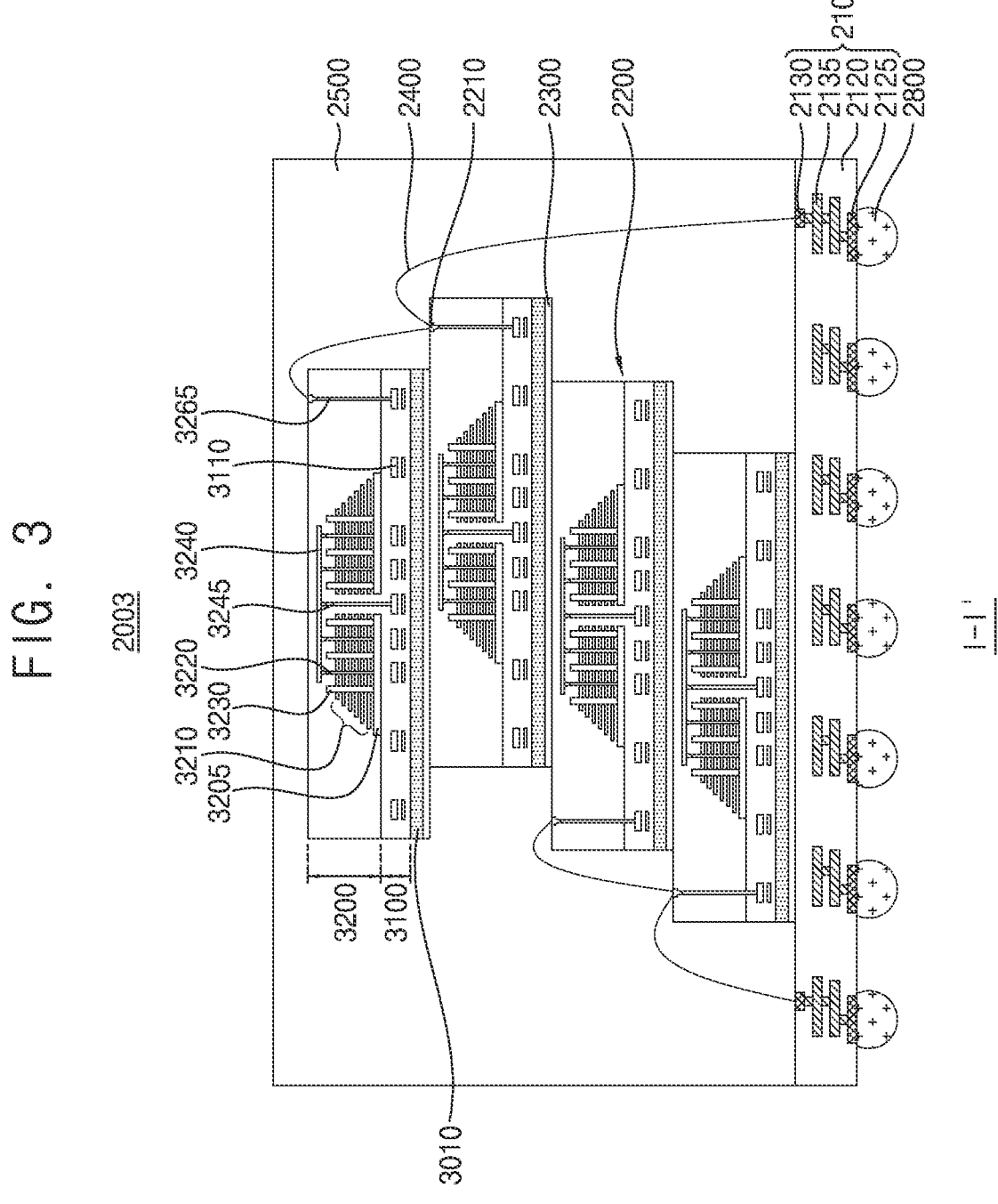
Figure 4:
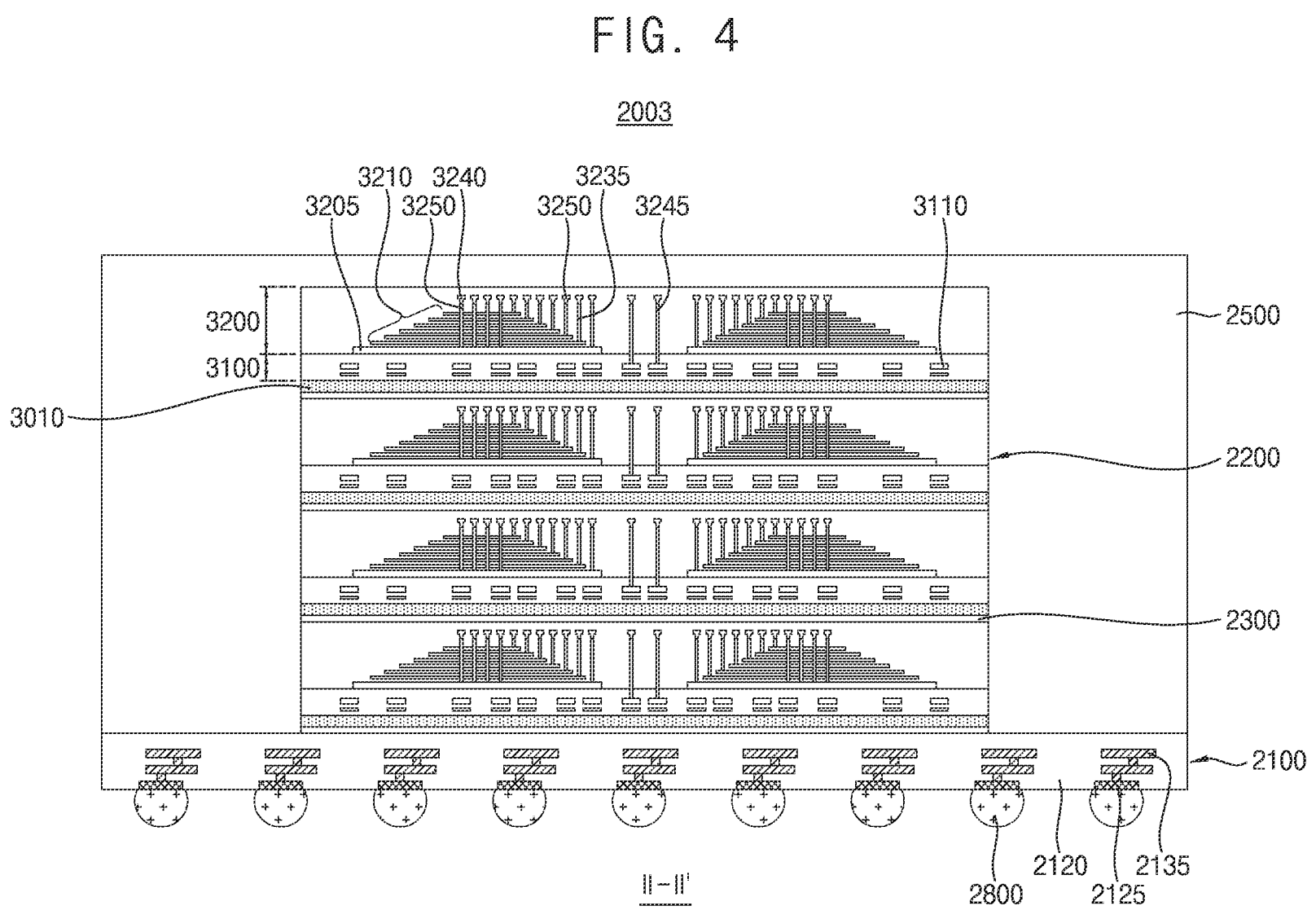

FIGS. 3 and 4 are sectional views schematically showing semiconductor packages according to an exemplary embodiment of the disclosure. FIG. 3 corresponds to line I-I' in FIG. 2. FIG. 4 corresponds to line II-II' in FIG. 2.

Referring to FIG. 3, in a semiconductor package 2003, a package substrate 2100 thereof may be a printed circuit board. The package substrate 2100 may include a package substrate body 2120, package upper pads 2130 disposed at a top surface of the package substrate body 2120, lower pads 2125 disposed at a bottom surface of the package substrate body 2120 or exposed through the bottom surface of the package substrate body 2120, and inner wirings 2135 electrically interconnecting the package upper pads 2130 and the lower pads 2125 within the package substrate body 2120. The package upper pads 2130 may be electrically connected to connecting structures 2400. The lower pads 2125 may be connected to the wiring patterns 2005 of the main substrate 2010 of the electronic system 2000 through conductive connectors 2800, as shown in FIG. 2.

Each of the semiconductor chips 2200 may include a semiconductor substrate 3010, and a first structure 3100 and a second structure 3200 sequentially stacked on the semiconductor substrate 3010. The first structure 3100 may include a peripheral circuit region including peripheral wirings 3110. The second structure 3200 may include a common source line 3205, a gate stack structure 3210 on the common source line 3205, memory channel structures 3220 and separation structures 3230 extending through the gate stack structure 3210, bit lines 3240 electrically connected to the memory channel structures 3220, and gate connecting wirings 3235 electrically connected to word lines ("WL" in FIG. 1) of the gate stack structure 3210.

Each of the semiconductor chips 2200 may include a through wiring 3245 electrically connected to the peripheral wirings 3110 of the first structure 3100 while extending into the second structure 3200. The through wiring 3245 may extend through the gate stack structure 3210, and may be further disposed outside the gate stack structure 3210. Each of the semiconductor chips 2200 may further include an input/output connecting wiring 3265 electrically connected to the peripheral wirings 3110 of the first structure 3100 while extending into the second structure 3200, and an input/output pad 2210 electrically connected to the input/output connecting wiring 3265.

Referring to FIG. 4, a semiconductor package 2003 may have a chip-to-chip (C2C) structure. The C2C structure may mean that an upper chip including a cell region is fabricated on a first wafer, a lower chip including a peripheral circuit region is fabricated on a second wafer different from the first wafer, and the upper chip and the lower chip are then interconnected through bonding. For example, the bonding method may mean a method of electrically interconnecting a bonding metal formed at an uppermost metal layer of the upper chip and a bonding metal formed at an uppermost metal layer of the lower chip. For example, when the bonding metals are made of copper (Cu), the bonding method may be a Cu-Cu bonding method. The bonding metals may also be made of aluminum (Al) or tungsten (W).

Figure 5:
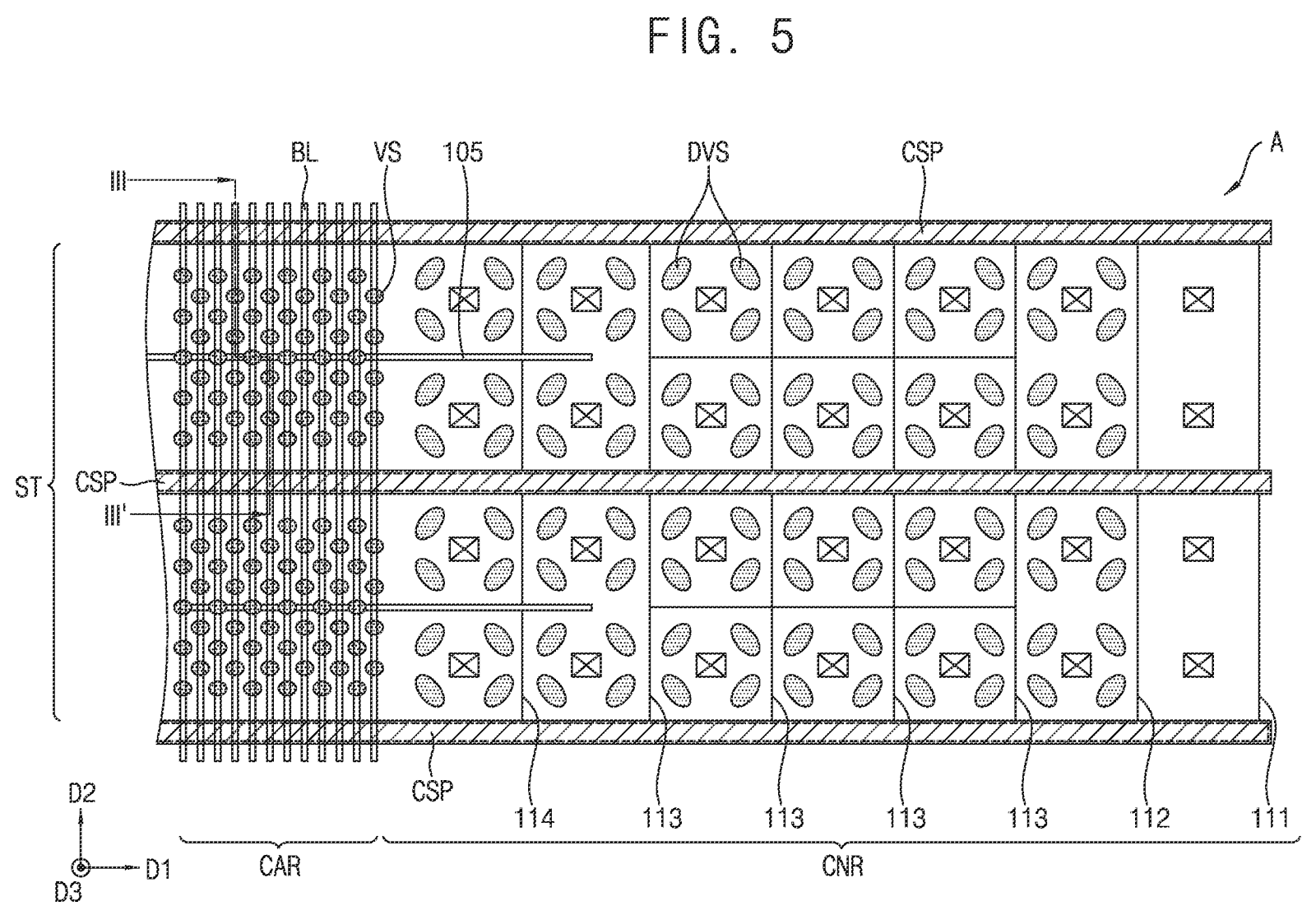
Figure 6:
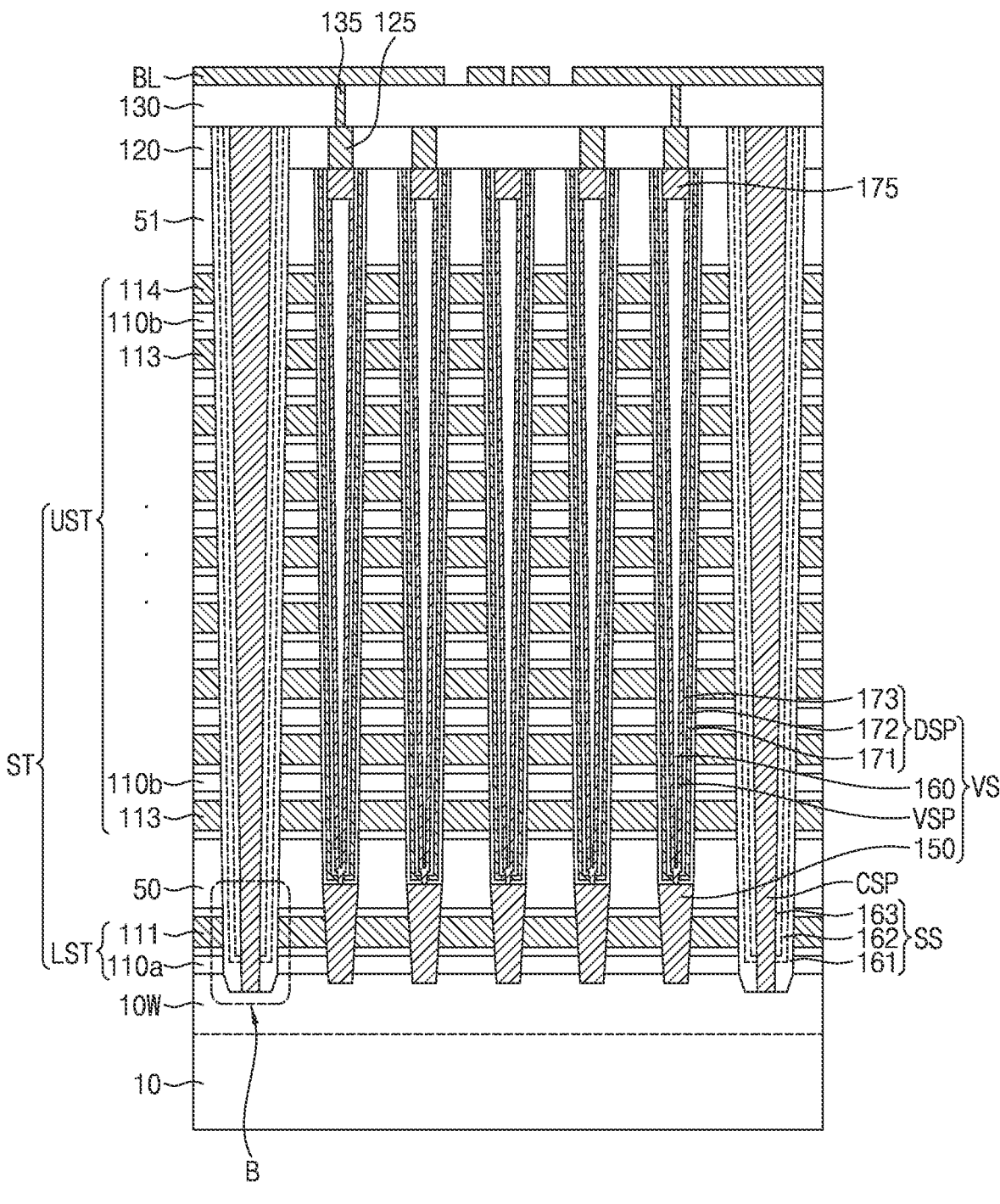
FIG. 6 is a schematic cross-sectional view according to the semiconductor device according to the exemplary embodiment of the disclosure.
Figure 7:
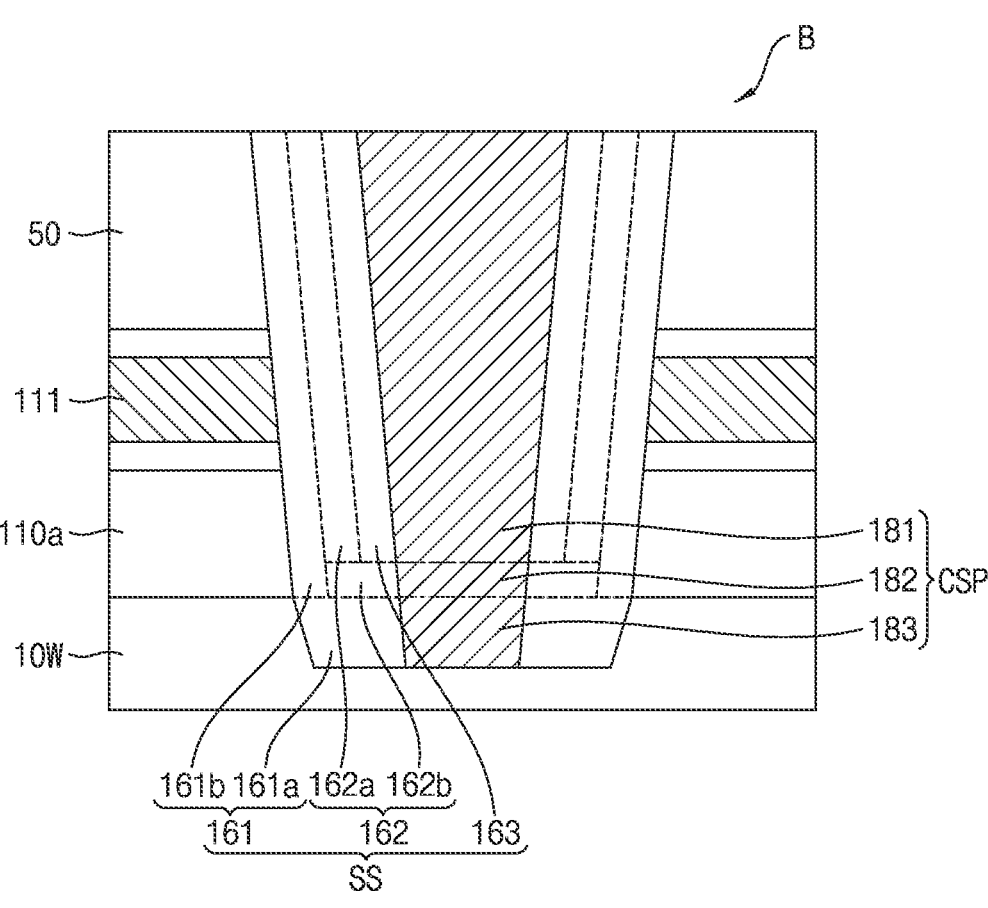
FIG. 7 is an enlarged view of a portion B of FIG. 6.

FIG. 5 is a plan view showing a portion of a top surface of a semiconductor device according to an exemplary embodiment of the disclosure. FIG. 6 is a schematic cross-sectional view according to the semiconductor device according to the exemplary embodiment of the disclosure. FIG. 7 is an enlarged view of a portion B of FIG. 6. FIG. 5 corresponds to a portion A of FIG. 2. FIG. 6 corresponds to line of FIG. 5.

Referring to FIGS. 5 to 7, a substrate 10 may include a cell array region CAR and a connection region CNR. The connection region CNR may be disposed around the cell array region CAR, and may be disposed between peripheral logic circuits (not shown). The substrate 10 may be one of a material having semiconductor characteristics (for example, a silicon wafer), an insulating material (for example, glass), and a semiconductor or a conductor covered by an insulating material. For example, the substrate 10 may be a silicon wafer having a first conductivity type.

The semiconductor device may include an electrode structure ST disposed on the substrate 10 in the cell array region CAR, a vertical structure VS extending through the electrode structure ST, and a data storage pattern DSP in the vertical structure VS. In addition, a wiring structure interconnecting memory cells and the peripheral logic circuits may be disposed in the connection region CNR.

A well impurity region 10$w$ may be provided in the cell array region CAR and the connection region CNR in the substrate 10. The well impurity region 10$w$ may include dopants (for example, phosphorous (P) or arsenic (As)) having a second conductivity type opposite to that of the substrate 10. In another example, the well impurity region 10$w$ may be omitted.

In an embodiment, the electrode structure ST may extend from the cell array region CAR to the connection region CNR in a first direction D1, and may have a staircase structure in the connection region CNR. A portion of the electrode structure ST may be disposed between common source plugs CSP extending in the first direction D1. A spacer SS made of an insulating material may be disposed between each common source plug CSP and the electrode structure ST.

The electrode structure ST may include electrodes 111, 113 and 114 stacked in a third direction D3 (namely, a thickness direction) perpendicular to the first and second directions D1 and D2. The electrodes 111, 113 and 114 of the electrode structure ST may have lengths in the first direction D1 gradually reduced as the electrodes 111, 113 and 114 extend away from the substrate 10. The electrode structure ST may have a height gradually reduced as the electrode structure ST extends away from the cell array region CAR. Each of the electrodes 111, 113 and 114 may have a pad portion in the connection region CNR. The pad portions of the electrodes 111, 113 and 114 may be disposed at horizontally and vertically different positions, respectively.

In an embodiment, the electrode structure ST may include a lower electrode structure LST, an upper electrode structure UST, and a lower planarization insulating film 50 provided between the lower electrode structure LST and the upper electrode structure UST. In this case, the lower electrode structure LST may include a lower electrode 111 and lower insulating films 110$a$ which are stacked on the substrate 10. The lower planarization insulating film 50 may cover the lower electrode structure LST in the cell array region CAR, and may cover a peripheral circuit structure in a peripheral circuit region. The upper electrode structure UST may include upper electrodes 113 and 114 and upper insulating films 110$b$ which are vertically alternately stacked on the lower planarization insulating film 50. The lower and upper electrodes 111, 113 and 114 may include, for example, at least one selected from a doped semiconductor (for example, doped silicon, etc.), a metal (for example, tungsten, copper, aluminum, etc.), a conductive metal nitride (for example, titanium nitride, tantalum nitride, etc.) or a transition metal (for example, titanium, tantalum, etc.). The lower insulating films 110a and the upper insulating films 110b may include a silicon oxide film and/or a low-k dielectric film.

In an embodiment, the lower electrode 111 may be an erase control gate electrode or a ground section gate electrode. In another embodiment, the lower electrode 111 may be a structure in which a plurality of ground selection gate electrodes is disposed on an erase control gate electrode.

The lower electrode 111 may be used as gate electrodes of erase control transistors ("ECT" in FIG. 1) to control an erase operation of a memory cell array. The lower electrode 111 may extend in the first direction D1. The lower electrode 111 may be used as a gate electrode of an erase control transistor ("ECT" in FIG. 1) to generate gate-induced drain leakage, or gate electrodes of ground selection transistors ("GST" in FIG. 1) to control electrical connection between a common source line ("CSL" in FIG. 1) and the vertical structure VS.

The upper electrodes 113 and 114 may include cell gate electrodes 113 and string section gate electrodes 114.

A plurality of cell gate electrodes 113 may be disposed at different levels from a top surface of the substrate 10, respectively. The cell gate electrodes 113 may be used as control gate electrodes ("WL0 to WL3" and "DWL" in FIG. 1) of memory cell transistors ("MCT" in FIG. 1).

The string selection gate electrodes 114 may be horizontally spaced apart from one another by an insulating film 105 isolating uppermost ones of the cell gate electrodes 113. Uppermost ones of the string selection gate electrodes 114 may be used as gate electrodes of string selection transistors ("SST1" and "SST2" in FIG. 1) to control electrical connection between a bit line BL and the vertical structure VS.

In an embodiment, the lower planarization insulating film 50 may be thicker than each lower insulating film 110a or each upper insulating film 110b. The lower planarization insulating film 50 may extend from the cell array region CAR to the connection region CNR. The lower planarization insulating film 50 may include a single insulating film or a plurality of stacked insulating films. For example, the lower planarization insulating film 50 may include a silicon oxide film and/or a low-k dielectric film.

An upper planarization insulating film 51 may be disposed to cover the entire front surface of the substrate 10 and, as such, may cover the electrode structure ST and the lower planarization insulating film 50 in the connection region CNR. The upper planarization insulating film 51 may have a substantially flat top surface. The upper planarization insulating film 51 may include a single insulating film or a plurality of stacked insulating films. For example, the upper planarization insulating film 51 may include a silicon oxide film and/or a low-k dielectric film.

The vertical structure VS may be disposed on the substrate 10 in the cell array region CAR. A dummy vertical structure DVS may be disposed on the substrate 10 in the connection region CNR. The vertical structure VS and the dummy vertical structure DVS may extend in the third direction D3 substantially perpendicular to the top surface of the substrate 10 and, as such, may extend through the electrode structure ST.

Vertical structures VS may be arranged in one direction or in a zigzag manner when viewed in a plan view. Dummy vertical structures DVS may extend through ends of the electrodes, respectively. For example, the vertical structures VS have the form of a pipe having a closed lower end.

In an embodiment, each of the vertical structures VS may include a vertical semiconductor pattern VSP and a lower semiconductor pattern 150. In an embodiment, the vertical semiconductor pattern VSP may extend through the upper electrode structure UST, and may extend up to the lower planarization insulating film 50. The vertical semiconductor pattern VSP may have the form of a pipe having a closed lower end. For example, the vertical semiconductor pattern VSP may have the form of a cup having an opened upper end and a closed lower end.

The vertical semiconductor pattern VSP may include a semiconductor material such as silicon (Si), germanium (Ge), or a mixture thereof. In addition, the vertical semiconductor pattern VSP may be a semiconductor doped with an impurity or an intrinsic semiconductor undoped with an impurity. The vertical semiconductor pattern VSP may include a polycrystalline semiconductor material. The vertical semiconductor pattern VSP, which includes a semiconductor material, may be used as channels of the erase control transistor ECT, the string and ground selection transistors SST and GST, and the memory cell transistors MCT described with reference to FIG. 1.

A bit line conductive pad 175 may be formed at an upper end of the vertical semiconductor pattern VSP. The bit line conductive pad 175 may be an impurity region doped with an impurity or may be made of a conductive material. The bit line conductive pad 175 may be electrically connected to the bit line BL. In accordance with some embodiments, as an erase voltage is applied to the bit line BL in an erase operation of the memory cell array, gate-induced leakage current may be generated at the string selection transistor ("SST" in FIG. 1) and the erase control transistor ("ECT" in FIG. 1).

In an embodiment, the lower semiconductor pattern 150 may extend up to the substrate 10 while extending through the lower electrode structure LST. The lower semiconductor pattern 150 may be an epitaxial layer epitaxially grown from the substrate 10. The lower semiconductor pattern 150 may have the form of a pillar filling a bottom portion of the vertical structure VS. A top portion of the lower semiconductor pattern 150 may contact a bottom portion of the vertical semiconductor pattern VSP. A top surface of the lower semiconductor pattern 150 may be disposed above a top surface of the lower electrode 111.

Each of the vertical structures VS may further include the data storage pattern DSP which is interposed between the vertical semiconductor pattern VSP and the electrode structure ST. The data storage pattern DSP may extend in the third direction D3, and may surround a side wall of the vertical semiconductor pattern VSP. The data storage pattern DSP may have the form of a pipe opened at upper and lower ends thereof. In an embodiment, a bottom portion of the data storage pattern DSP may contact the top portion of the lower semiconductor pattern 150. The data storage pattern DSP may include a data storage film of a NAND flash memory device. The data storage pattern DSP may include a charge storage film 172 between the vertical semiconductor pattern VSP and the electrode structure ST, a blocking insulating film 171 between the electrode structure ST and the charge storage film 172, and a tunnel insulating film 173 between the vertical semiconductor pattern VSP and the charge storage film 172. For example, the charge storage film 172 may include at least one of a silicon nitride film, a silicon oxynitride film, a silicon-rich (Si-rich) nitride film, nanocrystalline silicon, and a laminated trap layer. The blocking insulating film 171 may include a material having a greater bandgap than the charge storage film 172. The blocking insulating film 171 may include a high-k dielectric film such as an aluminum oxide film, a hafnium oxide film, etc. The tunnel insulating film 173 may include a material having a greater bandgap than the charge storage film 172. For example, the tunnel insulating film 173 may include a silicon oxide film.

Each of the vertical structures VS may include an insulating pattern 160 filling an interior of the vertical semiconductor pattern VSP. The insulating pattern 160 may include silicon oxide.

In an embodiment, the dummy vertical structure DVS may have a greater width than the vertical structure VS. The dummy vertical structure DVS may include substantially the same stack structure and material as the vertical structure VS.

First and second interlayer insulating films 120 and 130 may be sequentially stacked on the upper planarization insulating film 51. The first and second insulating films 120 and 130 may cover top surfaces of the vertical structure VS and the dummy vertical structure DVS.

First bit line contact plugs 125 may extend through the first interlayer insulating film 120, and may contact at least a part of the bit line conductive pads 175. Second bit line contact plugs 135 may extend through the second interlayer insulating film 130, and may contact at least a part of the first bit line contact plugs 125.

Bit lines BL may be disposed on the second interlayer insulating film 130 in the cell array region CAR. The bit lines BL may be electrically connected to the bit line conductive pads 175 and the vertical semiconductor patterns VSP adjacent thereto via the bit line contact plugs 125 and 135.

The common source plugs CSP may be provided at opposite sides of the electrode structure ST, respectively. Each common source plug CSP may extend in the first direction D1 in parallel to the electrode structure ST when viewed in a plan view. The common source plugs CSP may be disposed on both the cell array region CAR and the connection region CNR. The common source plugs CSP may be spaced apart from each other in the second direction D2 under the condition that the electrode structure ST is interposed therebetween.

Each common source plug CSP may have the form of a pillar. In an embodiment, the common source plug CSP may extend through the first interlayer insulating film 120, the upper planarization insulating film 51, the upper electrode structure UST, the lower planarization insulating film 50, and the lower electrode structure LST when viewed in a cross-sectional view. The common source plug CSP may be disposed on the substrate 10. The common source plug CSP may be connected to the well impurity region 10w.

For example, the common source plug CSP may include a metal material (tungsten (W), copper (Cu) or aluminum (Al)) or a transition metal material (titanium (Ti) or tantalum (Ta)).

The spacer SS may be disposed to surround a side wall of the common source plug CSP at a predetermined thickness. For example, the spacer SS may have a valley shape opened at opposite ends thereof (top and bottom portions thereof). A hole formed at the bottom portion of the spacer SS may be configured to allow the common source plug CSP to extend therethrough. The spacer SS may be interposed between the electrode structure ST and the common source plug CSP.

The spacer SS may include an insulating material (for example, a silicon oxide film or a silicon nitride film). In an embodiment, the spacer SS may be formed with a nitride film at an inner interface contacting the common source plug CSP and/or may include SiON therein.

In an embodiment, the spacer SS may include a plurality of nitride regions 161 to 163 respectively having different nitride (N) concentrations. For example, the nitride (N) concentration of the spacer SS at a predetermined height may be gradually increased as the spacer SS extends toward the common source plug CSP.

The spacer SS may include a first nitride region 161, a second nitride region 162 surrounding an outside portion of the first nitride region 161, and a third nitride region 163 surrounding an outside portion of the second nitride region 162. Here, the first to third nitride regions 161 to 163 may be regions having different nitride (N) concentrations, respectively.

In an embodiment, the first nitride region 161 may have a valley shape. An inside portion of the first nitride region 161 may contact the common source plug CSP. The area of the first nitride region 161 contacting the common source plug CSP may be greater than the area of each of the second nitride region 162 and the third nitride region 163 contacting the common source plug CSP. The outside portion of the first nitride region 161 and a bottom portion 161a of the first nitride region 161 may contact the second nitride region 162. A top portion 161b of the first nitride region 161 may contact the first interlayer insulating film 120.

The nitride (N) concentration in the first nitride region 161 may be gradually reduced as the first nitride region 161 extends from the inside thereof to the outside thereof. That is, the first nitride region 161 may have a highest nitride (N) concentration in a portion thereof contacting the common source plug CSP while having a lowest nitride (N) concentration in a portion thereof contacting the second nitride region 162. In an embodiment, the nitride (N) concentration in the first nitride region 161 may be continuously reduced as the first nitride region 161 extends from the inside thereof to the outside thereof. For example, the nitride (N) concentration in the first nitride region 161 may be b (%) to a (%) (a>b>0). In this case, the nitride (N) concentration in the first nitride region 161 may be a (%) at an innermost side thereof, and may be b (%) at an outermost side thereof.

In accordance with embodiments, the first nitride region 161 may be a nitride film formed at an inner wall of the spacer SS.

In an embodiment, the second nitride region 162 may have a valley shape formed with a hole at a bottom portion thereof. An inside portion of the second nitride region 162 may contact the outside portion of the first nitride region 161. The second nitride region 162 may include a first bottom region 162b and a first side wall region 162a.

The first bottom region 162b is defined as a bottom region of the second nitride region 162. The first bottom region 162b may contact the bottom portion of the first nitride region 161. The first bottom region 162b may be disposed under the first nitride region 161 and the first side wall region 162a. In addition, the first bottom region 162b may contact the common source plug CSP. For example, the first bottom region 162b may have a ring shape surrounding a part of an outside portion of the common source plug CSP.

The first side wall region 162a may be disposed over the first bottom region 162b and outside the first nitride region 161. The first side wall region 162a may not contact the first nitride region 161 and the common source plug CSP. For example, the first side wall region 162a may surround the first nitride region 161.

The nitride (N) concentration in the second nitride region 162 may be gradually reduced as the second nitride region 162 extends from the inside thereof to the outside thereof. For example, the nitride (N) concentration in the first side wall region 162a may be gradually reduced as the first side wall region 162a extends from the inside thereof to the outside thereof. The nitride (N) concentration in the first bottom region 162b may be gradually reduced as the first bottom region 162b extends from the upper side thereof to the lower side thereof. In an embodiment, the nitride (N) concentration in the second nitride region 162 may be continuously reduced as the second nitride region 162 extends from the inside thereof to the outside thereof. For example, the nitride (N) concentration in the second nitride region 162 may be c (%) to b (%) (b>c>0). In this case, the nitride (N) concentration in the first side wall region 162a of the second nitride region 162 may be b (%) at an innermost side thereof, and may be c (%) at an outermost side thereof. In addition, the nitride (N) concentration in the first bottom region 162b of the second nitride region 162 may be b (%) at an uppermost side thereof, and may be c (%) at a lowermost side thereof.

In an embodiment, the nitride (N) concentrations of the first nitride region 161 and the second nitride region 162 may be in continuity at an interface between the first nitride region 161 and the second nitride region 162. That is, the nitride (N) concentration at the outside portion of the first nitride region 161 and the nitride (N) concentration at the inside portion of the second nitride region 162 may be substantially the same.

In an embodiment, the third nitride region 163 may have a valley shape formed with a hole at a bottom portion thereof. An inside portion of the third nitride region 163 may contact the outside portion of the second nitride region 162. An outside portion of the third nitride region 163 may be adjacent to the electrode structure ST. In accordance with embodiments, the bottom portion of the third nitride region 163 may contact the well impurity region 10w in the substrate 10. The third nitride region 163 may include a second bottom region and a second side wall region.

The second bottom region is defined as a bottom region of the third nitride region 163. The second bottom region may contact the bottom portion of the second nitride region 162 (the first bottom region 162b). The second bottom region may be disposed under the second nitride region 162 and the second side wall region. In addition, the second bottom region may contact the common source plug CSP. For example, the second bottom region may have a ring shape surrounding a part of the outside portion of the common source plug CSP. The second bottom region may contact the substrate 10 (the well impurity region 10w).

The second side wall region may be disposed over the second bottom region and outside the first side wall region 162b. The second side wall region may not contact the second nitride region 162 and the common source plug CSP. For example, the second side wall region may surround the second nitride region 162. The second side wall region may contact the electrode structure ST.

The nitride (N) concentration in the third nitride region 163 may be gradually reduced as the third nitride region 163 extends from the inside thereof to the outside thereof. For example, the nitride (N) concentration in the second side wall region may be gradually reduced as the second side wall region extends from the inside thereof to the outside thereof. The nitride (N) concentration in the second bottom region may be gradually reduced as the second bottom region extends from the upper side thereof to the lower side thereof. In an embodiment, the nitride (N) concentration in the third nitride region 163 may be continuously reduced as the third nitride region 163 extends from the inside thereof to the outside thereof. For example, the nitride (N) concentration in the third nitride region 163 may be d (%) to c (%) (c>d>0). In this case, the nitride (N) concentration in the second side wall region of the third nitride region 163 may be c (%) at an innermost side thereof, and may be d(%) at an outermost side thereof. In addition, the nitride (N) concentration in the second bottom region of the third nitride region 163 may be c (%) at an uppermost side thereof, and may be d (%) at a lowermost side thereof. In accordance with embodiments, the nitride (N) concentration at the outermost side of the third nitride region 163 may be 0 (for example, d=0 (%)).

In an embodiment, the nitride (N) concentrations of the second nitride region 162 and the third nitride region 163 may be in continuity at an interface between the second nitride region 162 and the third nitride region 163. That is, the nitride (N) concentration at the outside portion of the second nitride region 162 and the nitride (N) concentration at the inside portion of the third nitride region 163 may be substantially the same.

Each common source plug CSP may include a first plug region 181, a second plug region 182, and a third plug region 183. The first plug region 181 may be defined as a region having the same height as a portion of the side wall of the common source plug CSP contacting the first nitride region 161. The second plug region 182 may be defined as a region having the same height as a portion of the side wall of the common source plug CSP contacting the second nitride region 162. The third plug region 183 may be defined as a region having the same height as a portion of the side wall of the common source plug CSP contacting the third nitride region 163.

The first plug region 181 may be disposed at an uppermost portion of the common source plug CSP, the third plug region 183 may be disposed at a lowermost portion of the common source plug CSP, and the second plug region 182 may be disposed between the first plug region 181 and the second plug region 183. The third plug region 183 may be connected to the substrate 10 (the well impurity region 10w) disposed thereunder.

Hereinafter, a method for manufacturing a semiconductor device will be described. In detail, a method for manufacturing a common source plug CSP and a spacer SS in a semiconductor device will be described hereinafter.

FIGS. 8 to 12 are cross-sectional views explaining a method for manufacturing a semiconductor device in accordance with an exemplary embodiment of the disclosure.

A common source plug CSP and a spacer SS may be formed after formation of an electrode structure ST, a vertical structure VS and a first interlayer insulating film 120.

Figure 8:
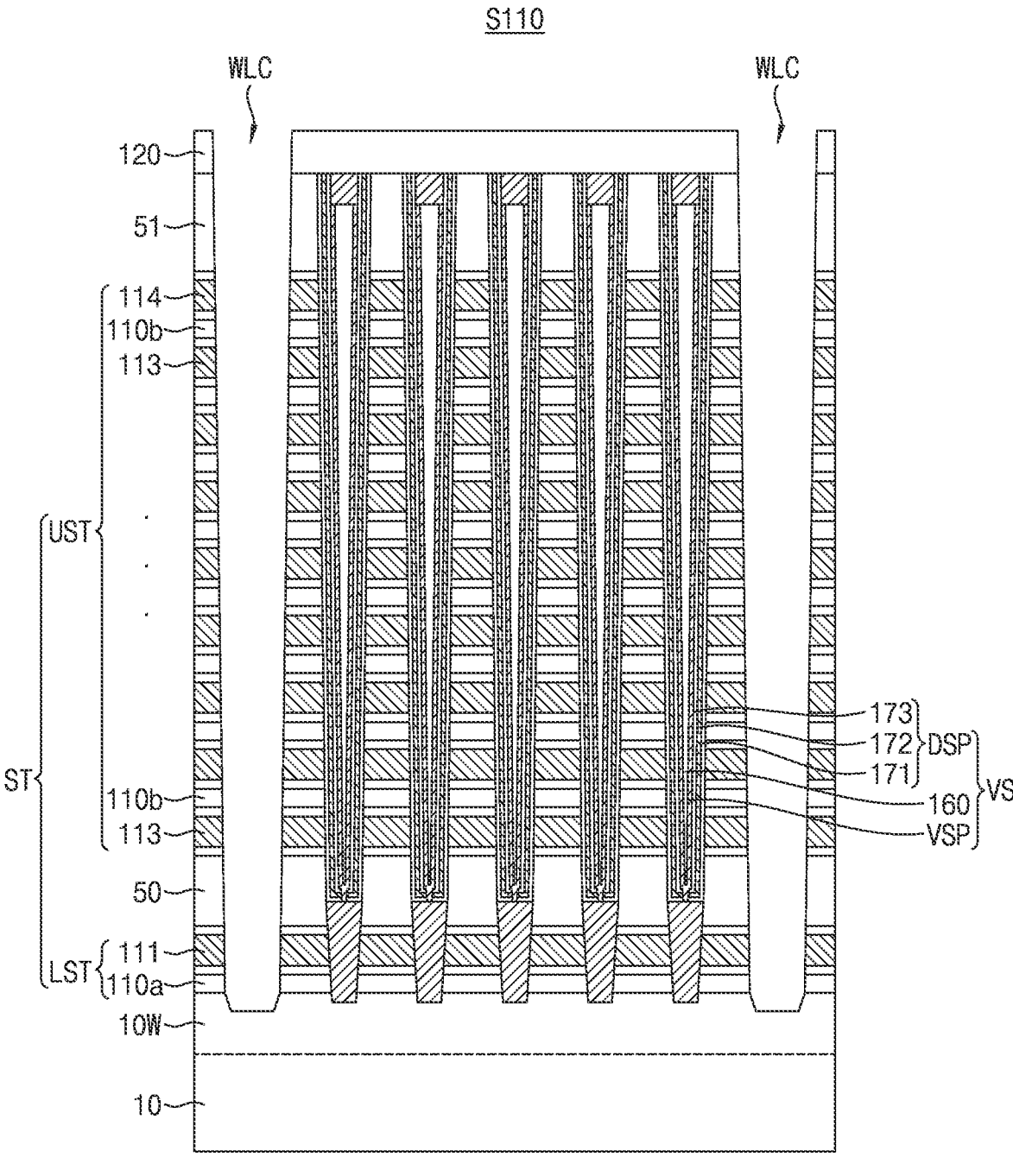
FIGS. 8 to 12 are cross-sectional views explaining a method for manufacturing a semiconductor device in accordance with an exemplary embodiment of the disclosure.

First, referring to operation S110 of FIG. 8, word line cuts WLC may be formed around the vertical structure VS. The word line cuts WLC may be formed through an etching process in which the word line cuts WLC extend through the first interlayer insulating film 120, an upper planarization insulating film 51, an upper electrode structure UST, a lower planarization insulating film 50 and a lower electrode structure LST, and a top portion of a substrate 10 (a well impurity region 10w) is partially removed to be exposed.

Figure 9:
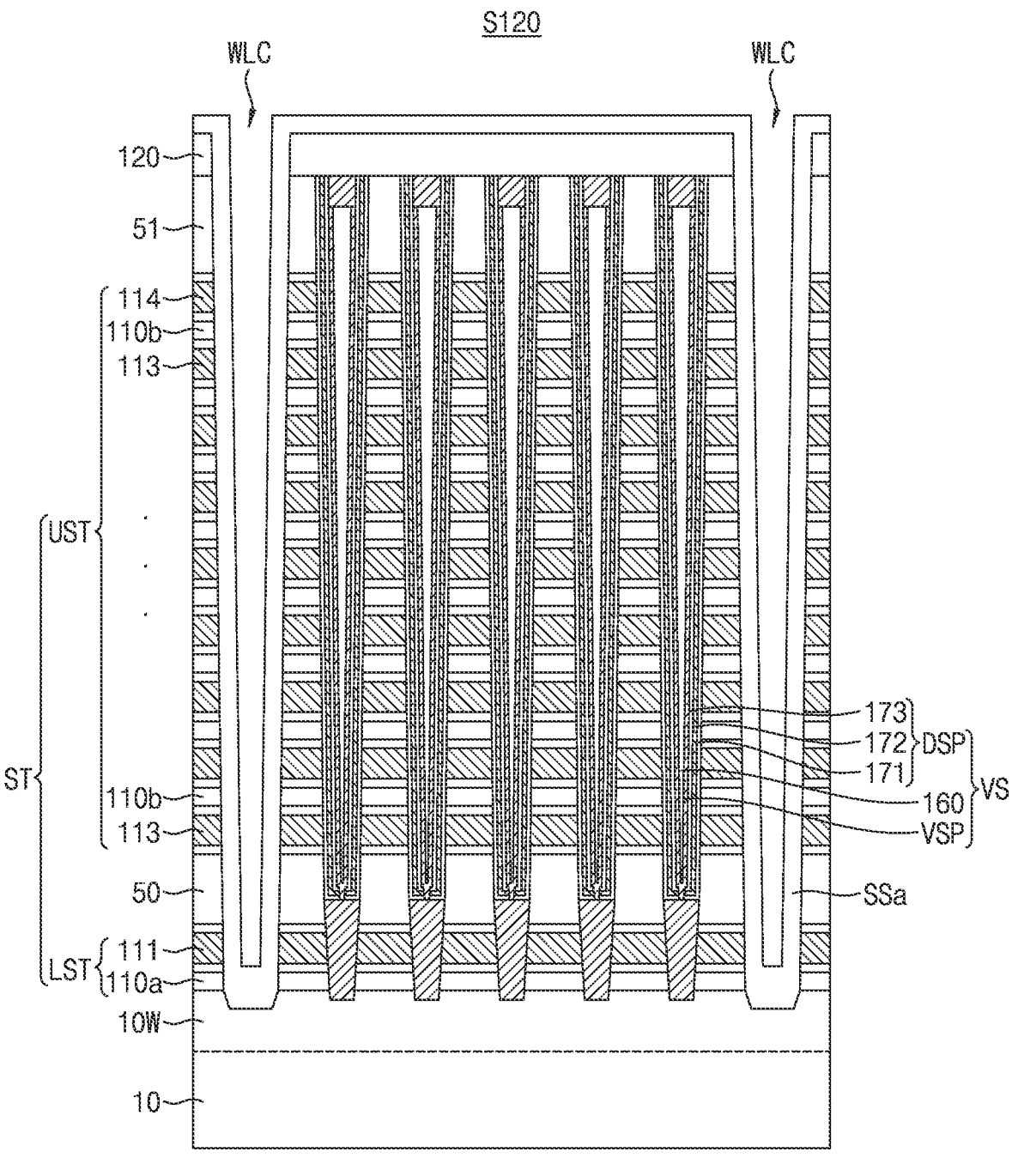

Thereafter, referring to operation S120 of FIG. 9, a spacer structure SSa may be formed to cover inner walls of the word line cuts WLC and an exposed portion of the substrate 10 (the well impurity region 10w). In accordance with embodiments, the spacer structure SSa may cover the word line cuts WLC and the first interlayer insulating layer 120.

For example, the spacer structure SSa may include an insulating material (for example, a silicon oxide film or a silicon nitride film).

The spacer structure SSa may be formed to have a predetermined thickness. For example, the spacer structure SSa may be formed to cover inner surfaces of the word line cuts WLC to a uniform thickness while filling a portion of each word line cut WLC. As the spacer structure SSa is formed, the width of each word line cut WLC may be reduced.

Subsequently, referring to operation S130 of FIG. 10, a nitridation process may be performed to form a nitride film on a surface of the spacer structure SSa. In an embodiment, the nitridation process may be achieved through a rapid thermal nitridation (RTN) process using nitride (N), nitric oxide (NO), ammonia (NH₃), etc., an annealing process, etc. In an embodiment, the RTN process may be performed at a temperature range of 650 to 850° C. for 50 to 70 secs.

In accordance with the nitridation process, nitride (N) may penetrate from an inner surface of the spacer structure SSa into the inside of the spacer structure SSa. In accordance with the nitridation process, the resultant spacer structure, that is, a spacer structure SSb, may be configured such that the nitride (N) concentration thereof is highest at the inner surface thereof while being lowest or 0 at an outer surface thereof. After the nitridation process, first to third nitride regions 161, 162, and 163 may be formed at the spacer structure SSb.

Figure 10:
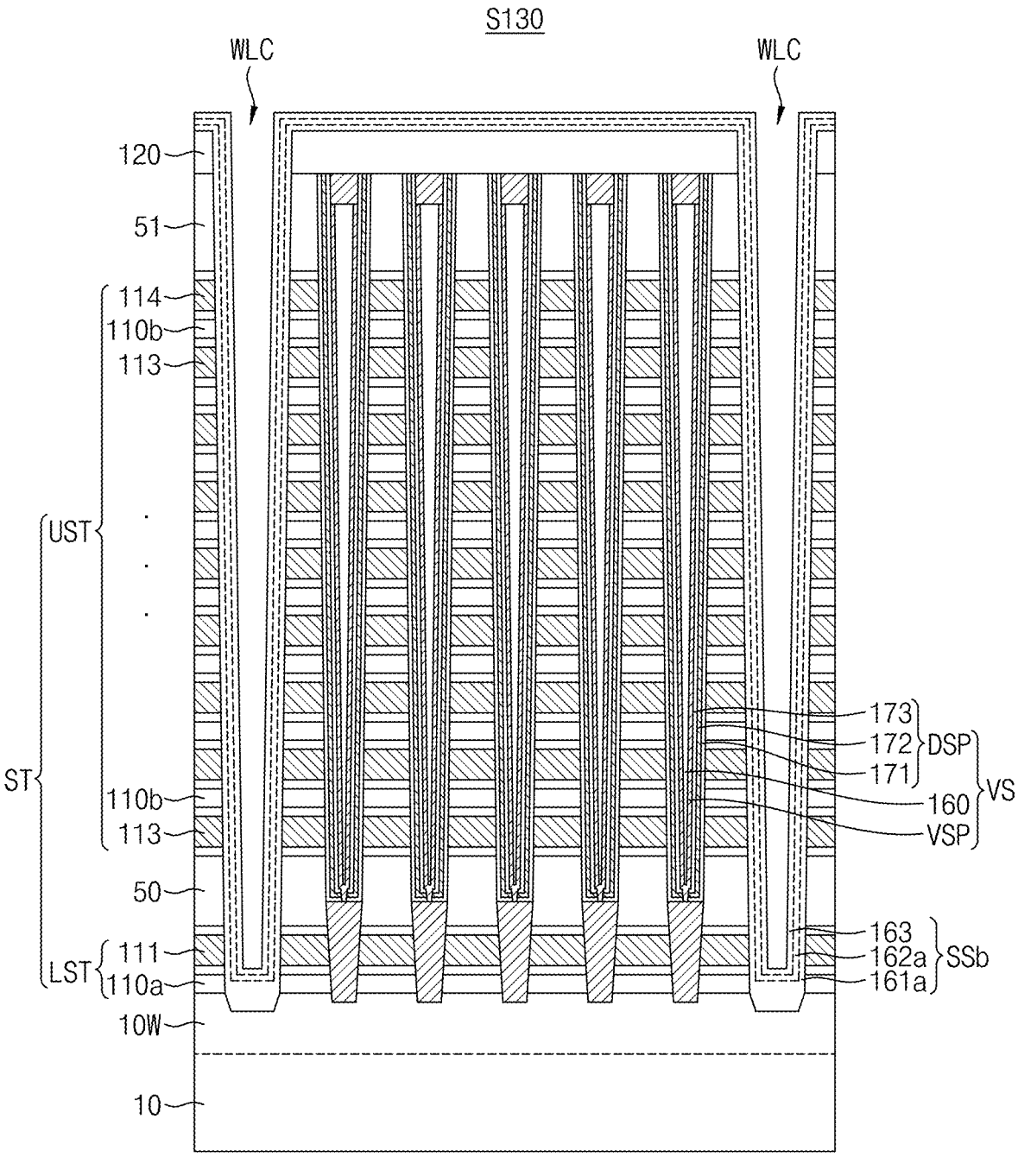
Figure 11:
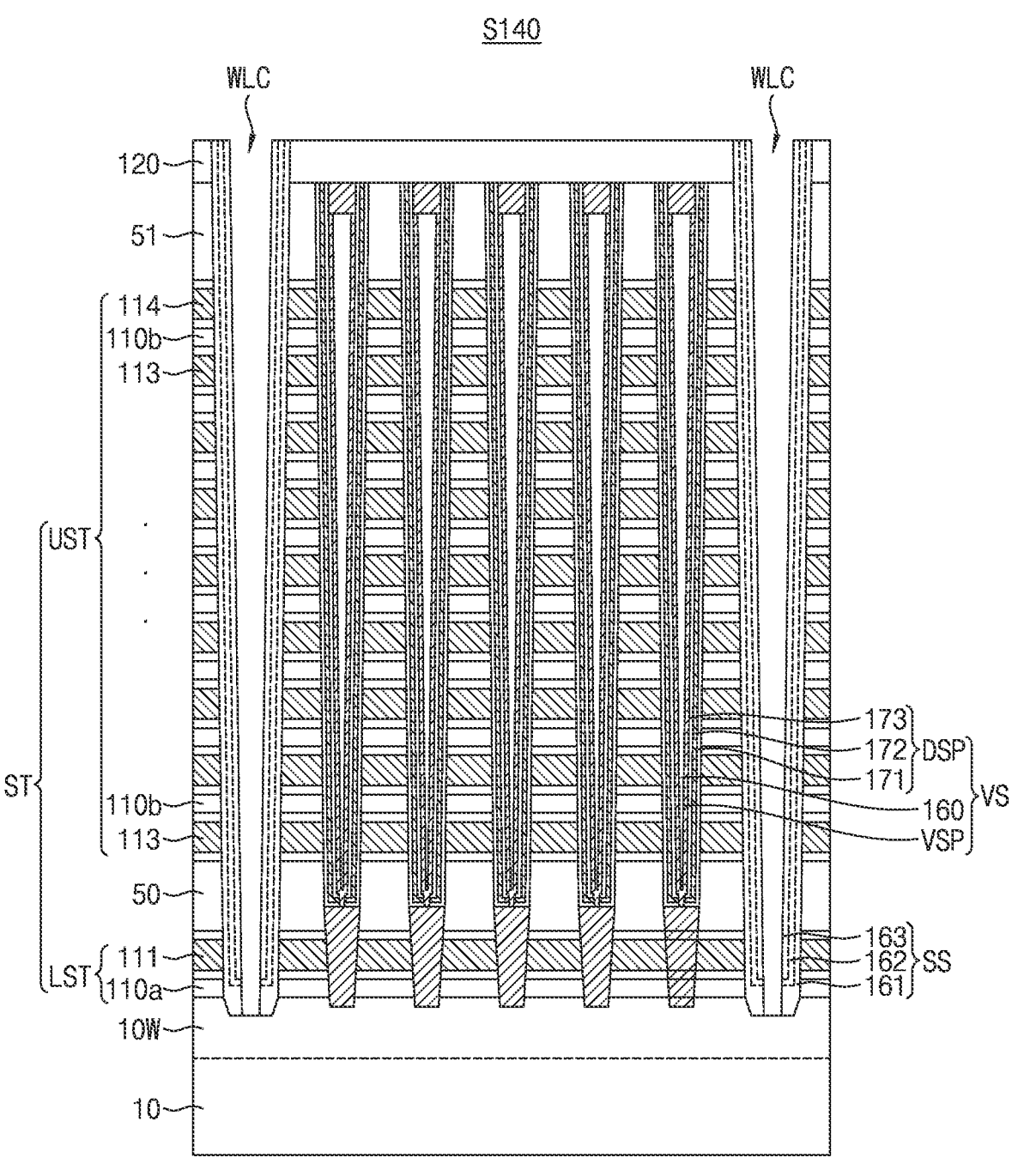

Next, referring to operation S140 of FIGS. 10 and 11, an anisotropic etching process or an etch-back process may be performed to remove a portion of the spacer structure SSb. The substrate 10 (the well impurity region 10w) may be again exposed to the inside of each word line cut WLC by the removed portion of the spacer structure SSb. In addition, a top surface of the first interlayer insulating film 120 may also be exposed by the removed portion of the spacer structure SSb. The spacer structure SSb may become the above-described spacer SS. In this case, the second nitride region 162 and the third nitride region 163 may be exposed to the inside of each word line cut WLC.

Figure 12:
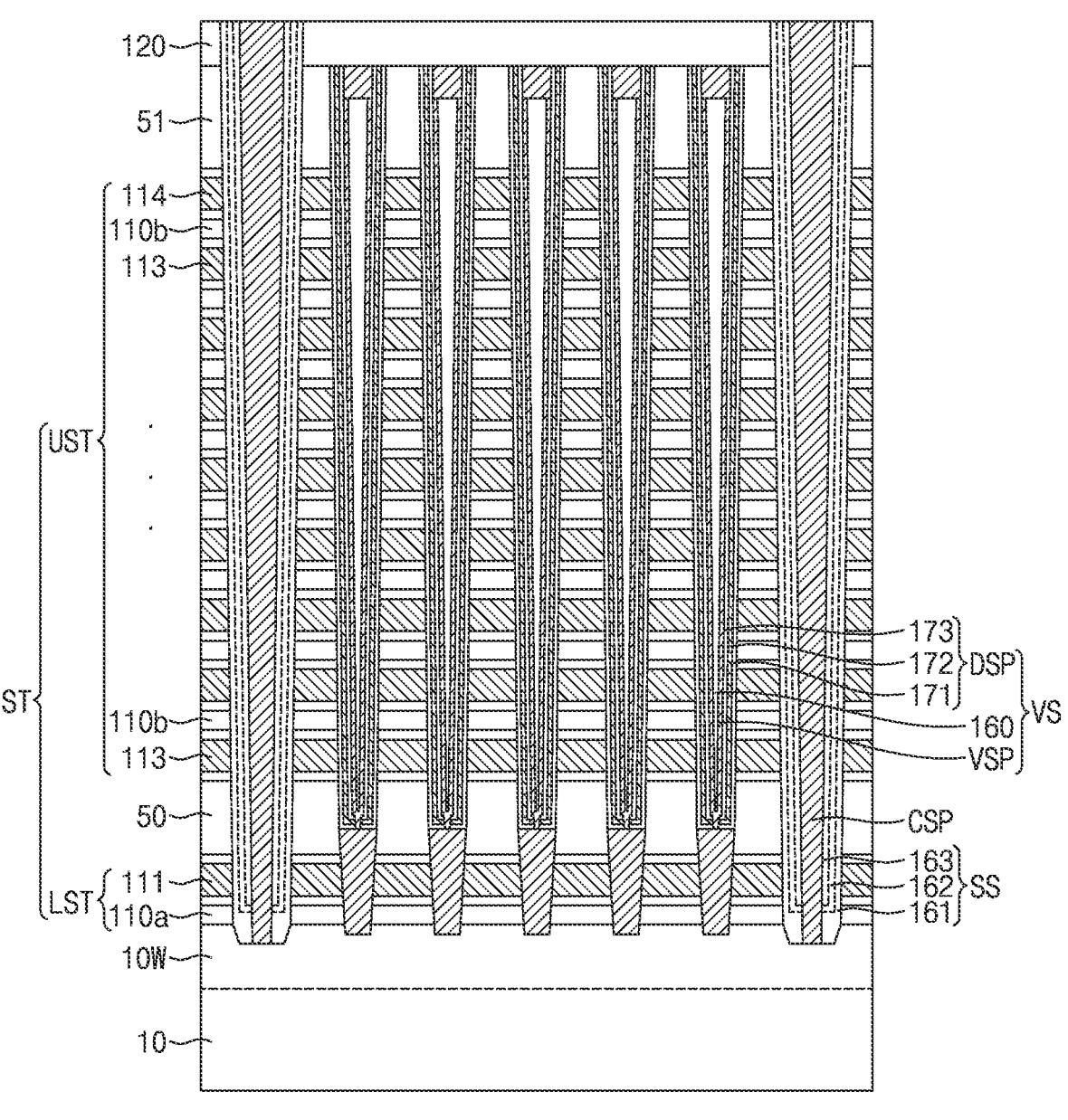

Thereafter, referring to operation S150 of FIG. 12, a common source plug CSP filling each word line cut WLC may be formed For example, the common source plug CSP may be formed at the inside of the spacer SS in the word line cut WLC. The common source plug CSP may be formed to contact all of the first to third nitride regions 161 to 163.

Next, a semiconductor device according to another embodiment of the disclosure will be described. In the following description, no description will be given of the same constituent elements as those of FIG. 6, and reference numerals identical or similar to those of FIG. 6 designate the same constituent elements.

Figure 13:
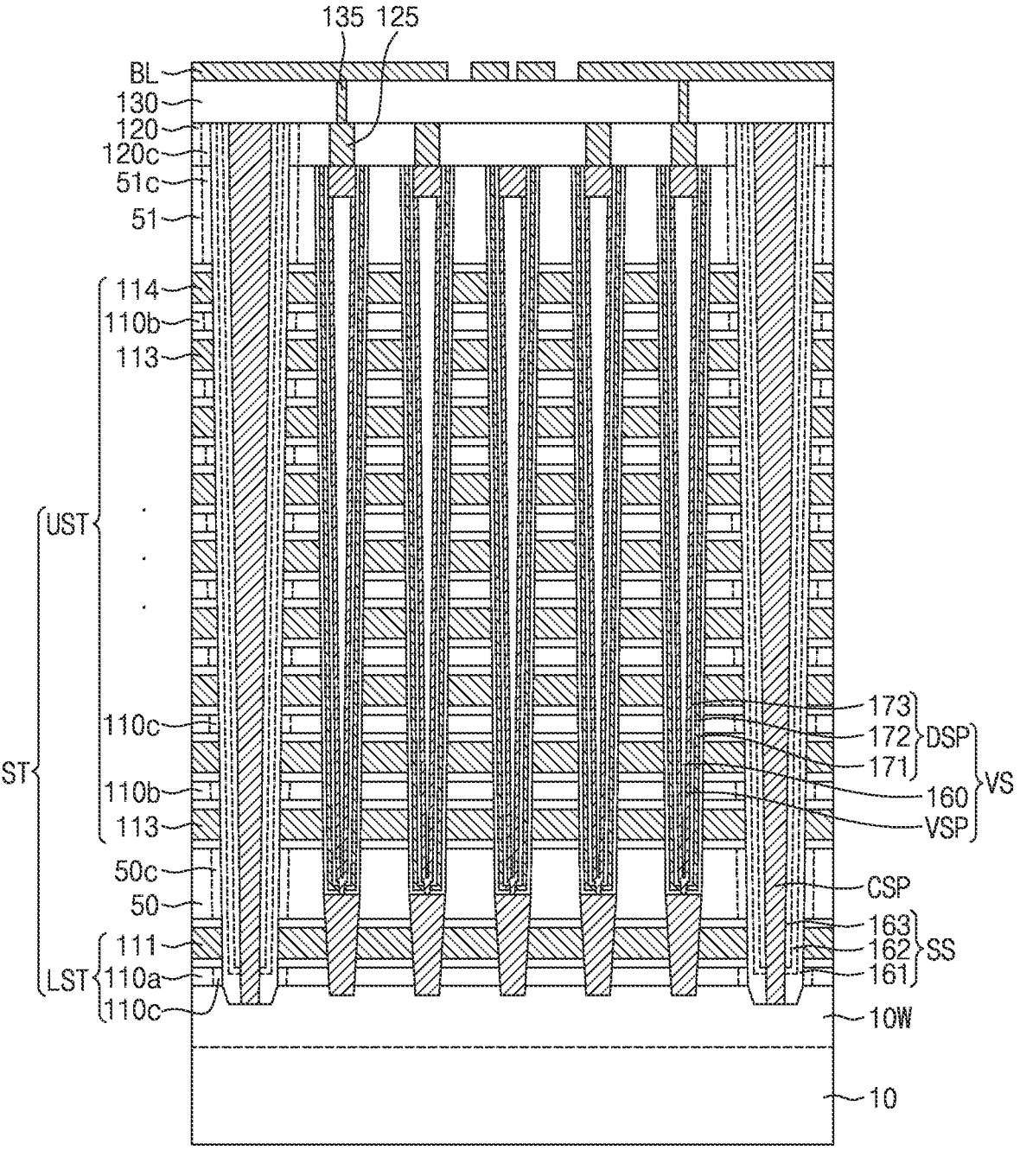
FIG. 13 is a schematic cross-sectional view of a semiconductor device according to an exemplary embodiment of the disclosure.

FIG. 13 is a schematic cross-sectional view of a semiconductor device according to an exemplary embodiment of the disclosure.

Referring to FIG. 13, the semiconductor device according to this embodiment differs from the semiconductor device of FIG. 6 in that a first interlayer insulating film 120, an upper planarization insulating film 51, upper insulating films 110b, a lower planarization insulating film 50 and lower insulating films 110a include nitride (N).

In an embodiment, each of the first interlayer insulating film 120, the upper planarization insulating film 51, the upper insulating films 110b, the lower planarization insulating film 50 and the lower insulating films 110a may include nitride (N) in a region (for example, "110c", "50c", "51c" or "120c") extending from an interface to a spacer SS up to a predetermined depth in a direction perpendicular to the interface. In a nitridation process for formation of the spacer SS, nitridation may be achieved in the regions 110c, 50c, 51c and 120c of the first interlayer insulating film 120, the upper planarization insulating film 51, the upper insulating films 110b, the lower planarization insulating film 50 and the lower insulating films 110a. For example, each of the first interlayer insulating film 120, the upper planarization insulating film 51, the upper insulating films 110b, the lower planarization insulating film 50 and the lower insulating films 110a may have a nitride (N) concentration of not less than 0 in the region thereof (for example, "110c", "50c", "51c" or "120c") extending from the interface to the spacer SS up to the predetermined depth, and the nitride (N) concentration may be gradually reduced as the region extends away from the spacer SS.

Figure 14:
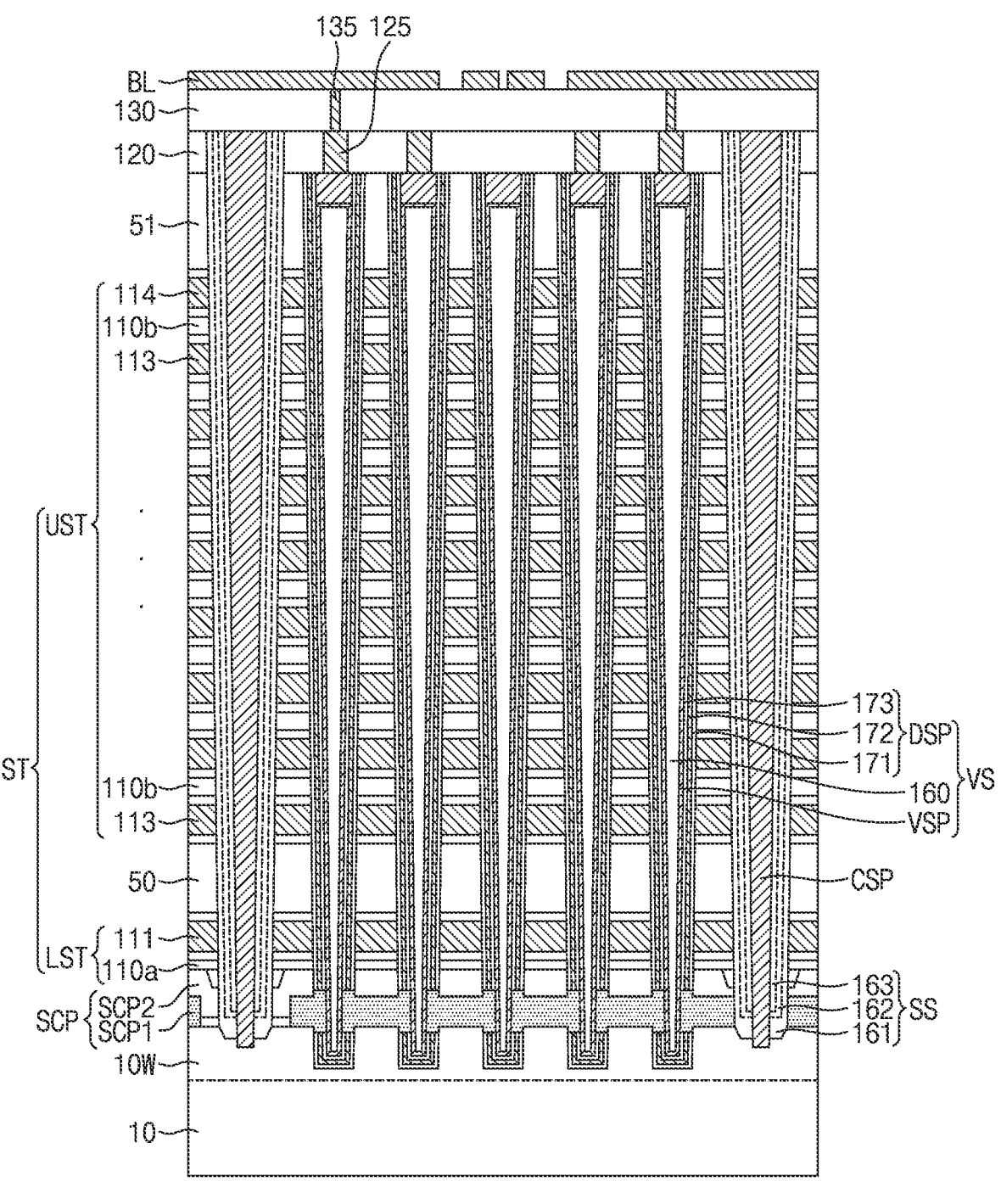
FIG. 14 is a schematic cross-sectional view of a semiconductor device according to an exemplary embodiment of the disclosure.

FIG. 14 is a schematic cross-sectional view of a semiconductor device according to an exemplary embodiment of the disclosure.

Referring to FIG. 14, the semiconductor device according to this embodiment differs from the semiconductor device of FIG. 6 in that the semiconductor device further includes a source structure SCP disposed between an electrode structure ST and a substrate 10.

In an embodiment, the source structure SCP may be disposed on a well impurity region 10w. The source structure SCP may be parallel to a top surface of the substrate 10, and may extend in parallel to the electrode structure ST (for example, in a first direction D1). The source structure SCP may include first and second source conductive patterns SCP1 and SCP2 which are sequentially stacked. The first source conductive pattern SCP1 may contact the well impurity region 10w, and the second source conductive pattern SCP2 may directly contact a top surface of the first source conductive pattern SCP1. Meanwhile, in another example, a gate insulating film may be disposed between the first source conductive pattern SCP1 and the well impurity region 10w.

The first and second source conductive patterns SCP1 and SCP2 may be made of a semiconductor material doped with dopants (for example, phosphorous (P) or arsenic (As)) having a second conductivity type opposite to the conductivity type of the substrate 10. In embodiments, the first and second source conductive patterns SCP1 and SCP2 may be made of polysilicon doped with n-type dopants. The concentration of the n-type dopants may be greater at the first source conductive pattern SCP1 than at the second source conductive pattern SCP2.

In an embodiment, the first source conductive pattern SCP1 may directly contact portions of side walls of vertical semiconductor patterns VS. The first source conductive pattern SCP1 may include a portion surrounding a portion of the side wall of each vertical semiconductor pattern VS while contacting the portion of the side wall of the vertical semiconductor pattern VS, and a portion substantially parallel to the top surface of the substrate 10 under the electrode structure ST. The first source conductive pattern SCP1 may be disposed at a lower level than a bottom surface of a lower electrode 111.

Figure 15:
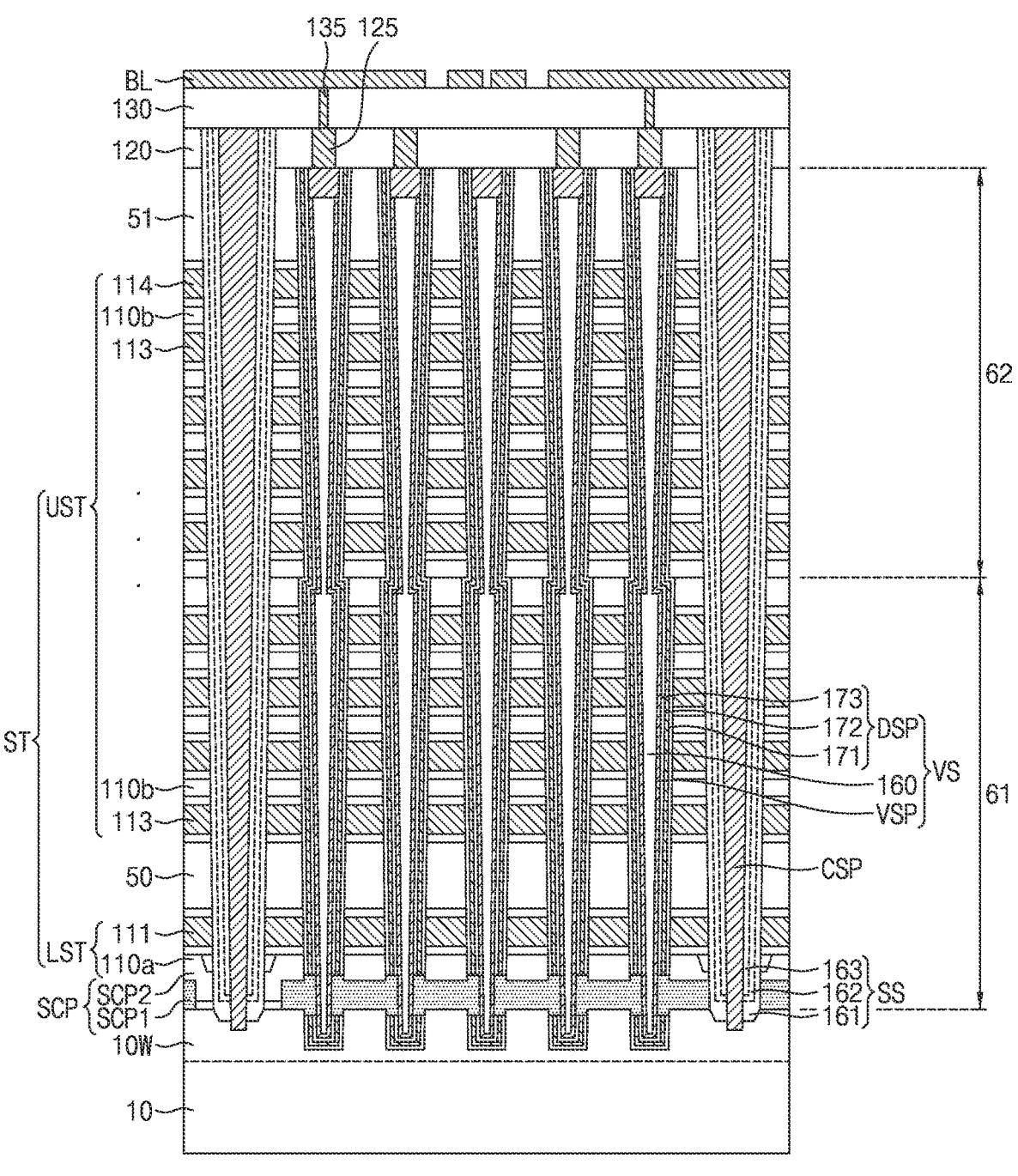
FIGS. 15 and 16 are schematic cross-sectional views of semiconductor devices according to exemplary embodiments of the disclosure, respectively.
Figure 16:
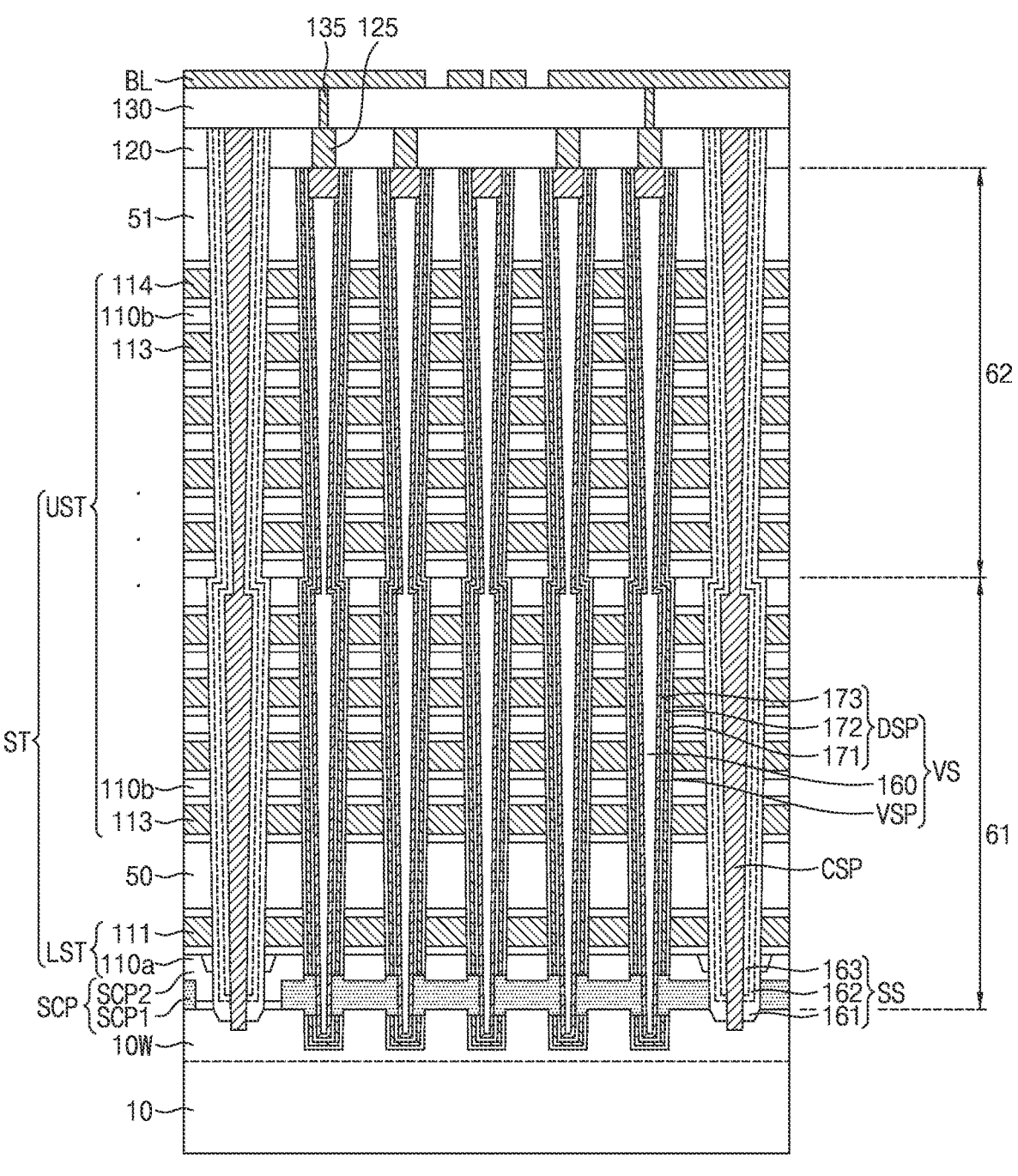

FIGS. 15 and 16 are schematic cross-sectional views of semiconductor devices according to exemplary embodiments of the disclosure, respectively.

Referring to FIGS. 15 and 16, the semiconductor devices according to these embodiments differ from the semiconductor device of FIG. 14 in that the semiconductor devices have a multi-stack structure.

In an embodiment, a lower stack structure 61 and an upper stack structure 62 may be disposed on a substrate 10. For example, the lower stack structure 61 may include a source structure SCP, a lower electrode structure LST and a portion of an upper electrode structure UST. The upper stack structure 62 may include the remaining portion of the upper electrode structure UST.

The upper stack structure 62 may be formed after formation of the lower stack structure 61. Accordingly, the planar area of the vertical structure VS according to the height of the vertical structure VS when viewed in a plan view may not be in continuity at an interface between the upper stack structure 62 and the lower stack structure 61. For example, the area of the vertical structure VS at a top surface of the lower stack structure 61 may be greater than the area of the vertical structure VS at a bottom surface of the upper stack structure 62.

Meanwhile, in some embodiments, as shown in FIG. 15, the planar area of a common source plug CSP according to the height of the common source plug CSP may be in continuity at the interface between the upper stack structure 62 and the lower stack structure 61. Since the common source plug CSP is formed after formation of the entire portion of the electrode structure ST, the planar area of the common source plug CSP in the multi-stack structure may also be in continuity in accordance with the height of the common source plug CSP.

In some embodiments, as shown in FIG. 16, the planar area of the common source plug CSP according to the height of the common source plug CSP may not be in continuity.

Figure 17:
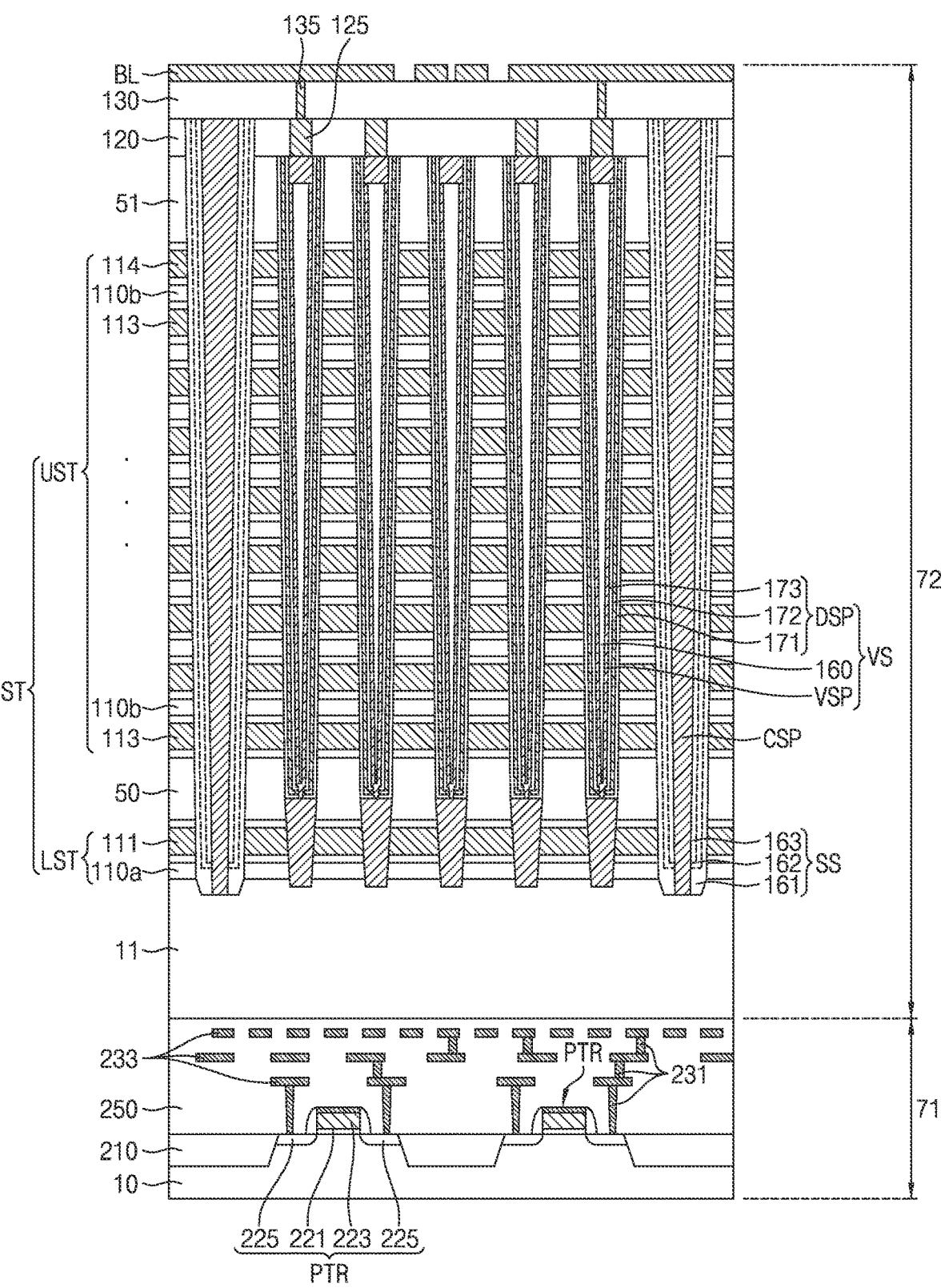
FIG. 17 is a schematic cross-sectional view of a semiconductor device according to an exemplary embodiment of the disclosure.

FIG. 17 is a schematic cross-sectional view of a semiconductor device according to an exemplary embodiment of the disclosure.

Referring to FIG. 17, the semiconductor device according to this embodiment differs from the semiconductor device of FIG. 6 in that the semiconductor device further includes a peripheral logic structure 71 disposed under an electrode structure ST while overlapping with the electrode structure ST.

An element isolation film 210 defining active regions may be formed at the substrate 10.

In an embodiment, the semiconductor device may further include peripheral logic circuits PTR integrated on a substrate 10, and a lower buried insulating film 250 covering the peripheral logic circuits PTR.

The peripheral logic circuits PTR may be formed in a region other than the element isolation film 210 of the substrate 10. The peripheral logic circuits PTR may be row and column decoders, a page buffer, a control circuit, etc. The peripheral logic circuits PTR may include NMOS and PMOS transistors, low-voltage and high-voltage transistors, resistors, etc. which are integrated on the substrate 10. For example, the peripheral logic circuits PTR may include a gate insulating film 221 on the substrate 10, a peripheral gate electrode 223 on the gate insulating film 221, and source/drain regions 225 at opposite sides of the peripheral gate electrode 223.

Peripheral circuit wirings 233 may be disposed on the substrate 10. The peripheral circuit wirings 233 may be electrically connected to the peripheral logic circuits PTR via peripheral circuit contact plugs 231. For example, the peripheral contact plugs 231 and the peripheral circuit wirings 233 may be connected to the NMOS and PMOS transistors.

The lower buried insulating film 250 may be disposed on the substrate 10. The lower buried insulating film 250 may cover the peripheral logic circuits PTR, the peripheral circuit contact plugs 231 and the peripheral circuit wirings 233 on the substrate 10. The lower buried insulating film 250 may include insulating films stacked to form a multilayer structure. For example, the lower buried insulating film 250 may include a silicon oxide film, a silicon nitride film, a silicon oxynitride film and/or a low-k dielectric film.

A cell array structure 72 may overlap with the peripheral logic structure 71. The cell array structure 72 may be disposed on the lower buried insulating film 250, and may include a horizontal semiconductor layer 11, an electrode structure ST, etc. The horizontal semiconductor layer 11 may be stacked on a top surface of the lower buried insulating film 50. The horizontal semiconductor layer 11 may be made of a semiconductor material, and may include, for example, at least one of silicon (Si), germanium (Ge), silicon germanium (SiGe), gallium-arsenic (GaAs), indium-gallium-arsenic (InGaAs), aluminum-gallium-arsenic (AlGaAs), or a mixture thereof. In addition, the horizontal semiconductor layer 11 may include a semiconductor doped with a first conductivity type impurity or an intrinsic semiconductor undoped with an impurity. In addition, the horizontal semiconductor layer 100 may have a crystalline structure including at least one selected from a monocrystalline structure, an amorphous structure, and a polycrystalline structure.

The electrode structure ST and common source plugs CSP may be disposed on the horizontal semiconductor layer 11. The common source plugs CSP may be connected to the horizontal semiconductor layer 11.

In accordance with the exemplary embodiments of the disclosure, it may be possible to minimize damage to a semiconductor device even in a high-temperature process in manufacture of the semiconductor device.

While the embodiments of the disclosure have been described with reference to the accompanying drawings, it should be understood by those skilled in the art that various modifications may be made without departing from the scope of the disclosure and without changing essential features thereof. Therefore, the above-described embodiments should be considered in a descriptive sense only and not for purposes of limitation.

What is claimed is:

1. A semiconductor device comprising:

a substrate;

an electrode structure disposed on the substrate while extending in a first direction, the electrode structure including a plurality of electrodes stacked in a second direction which is a vertical direction of the substrate;

a bit line disposed on the electrode structure;

vertical structures extending through the electrode structure in the second direction and contacting the substrate, each of the vertical structures including a vertical semiconductor pattern electrically connected to the bit line, and a data storage pattern surrounding a side wall of the vertical semiconductor pattern;

common source plugs extending through the electrode structure in the second direction and contacting the substrate under a condition that the vertical structures are disposed among the common source plugs; and spacers respectively disposed to surround side walls of the common source plugs, each of the spacers including regions i) respectively including silicon oxynitride (SiON) and ii) having different nitride (N) concentrations, wherein the regions of each of the spacers include a first nitride region disposed adjacent to a corresponding one of the common source plugs, a second nitride region surrounding the first nitride region, and a third nitride region surrounding the second nitride region, wherein the each of the common source plugs penetrates the each of the spacers in the second direction, wherein the second nitride region includes a first bottom region disposed under the first nitride region, and a first side wall region disposed over the first bottom region and surrounding the first nitride region, and wherein the third nitride region includes a second bottom region disposed under the first bottom region of the second nitride region, and a second side wall region over the second bottom region and surrounding the first side wall region of the second nitride region, wherein the first nitride region has a nitride (N) concentration of b (%) to a (%) (a>b), wherein the second nitride region has a nitride (N) concentration of c (%) to b (%) (b>c), and wherein the third nitride region has a nitride (N) concentration of d (%) to c (%) (c>d).

2. The semiconductor device according to claim 1, wherein the nitride (N) concentration of the first nitride region is gradually reduced as the first nitride region extends from the corresponding one of the common source plugs to the second nitride region.

3. The semiconductor device according to claim 1, wherein all of the first nitride region, the first bottom region and the second bottom region contact the corresponding common source plug.

4. The semiconductor device according to claim 1, wherein:

the second bottom region contacts the substrate; and the second side wall region contacts the electrode structure.

5. The semiconductor device according to claim 1, wherein the first side wall region and the second side wall region do not contact the common source plugs.

6. The semiconductor device according to claim 1, wherein:

the nitride (N) concentrations of the first nitride region and the second nitride region are in continuity at an interface between the first nitride region and the second nitride region; and the nitride (N) concentrations of the second nitride region and the third nitride region are in continuity at an interface between the second nitride region and the third nitride region.

7. The semiconductor device according to claim 1, wherein the third nitride region includes an outermost side having a nitride (N) concentration of 0 (%).

8. The semiconductor device according to claim 1, wherein the nitride (N) concentration of each of the spacers is gradually increased as the spacer extends toward a corresponding one of the common source plugs at a predetermined height.

9. The semiconductor device according to claim 1, wherein:

the vertical structures further include insulating films disposed among the plurality of electrodes; and the insulating films include nitride (N).

10. The semiconductor device according to claim 9, wherein the insulating films have a nitride (N) concentration gradually reduced as the insulating films extend away from the spacers.

11. A method for manufacturing a semiconductor device, comprising:

forming a word line cut to extend through an electrode structure, which includes a plurality of electrodes formed on a substrate and stacked in a vertical direction, around a vertical structure extending through the electrode structure in the vertical direction, and to expose the substrate;

forming a silicon oxynitride spacer at an inner wall of the word line cut and an exposed portion of the substrate to a predetermined thickness;

performing a nitridation process at a surface of the spacer;

performing an etch-back process at a bottom portion of the spacer such that the substrate is again exposed; and forming a common source plug filling the word line cut, wherein, through the nitridation process, the spacer is formed with a first nitride region disposed adjacent to the common source plug while having a nitride (N) concentration of b (%) to a (%) (a>b), a second nitride region surrounding the first nitride region while having a nitride (N) concentration of c (%) to b (%) (b>c), and a third nitride region surrounding the second nitride region while having a nitride (N) concentration of d (%) to c (%) (c>d).

12. The method according to claim 11, wherein the nitridation process includes a rapid thermal nitridation (RTN) process.

13. The method according to claim 12, wherein the RTN process is performed in a temperature range of 650 to 850° C., using ammonia (NH$_3$).

14. The method according to claim 13, wherein the RTN process is performed for 50 to 70 secs.

15. The method according to claim 11, wherein all of the first nitride region, the second nitride region and the third nitride region contact the common source plug through formation of the common source plug.

16. A semiconductor device comprising:

a main substrate; and a controller, one or more semiconductor packages, and a DRAM which are mounted on the main substrate, wherein each of the semiconductor packages includes:

a package substrate, semiconductor chips disposed on the package substrate, a connection structure interconnecting the semiconductor chips, and a molding layer covering the semiconductor chips and the connection structure on the package substrate, wherein each of the semiconductor chips includes:

a substrate, an electrode structure disposed on the substrate while extending in a first direction, the electrode structure including a plurality of electrodes stacked in a second direction which is a vertical direction of the substrate, a bit line disposed on the electrode structure, vertical structures extending through the electrode structure in the second direction and contacting the substrate, each of the vertical structures including a vertical semiconductor pattern electrically connected to the bit line, and a data storage pattern surrounding a side wall of the vertical semiconductor pattern, common source plugs extending through the electrode structure in the second direction and contacting the substrate under a condition that the vertical structures are disposed among the common source plugs, and spacers respectively disposed to surround side walls of the common source plugs, each of the spacers including regions i) respectively including silicon oxynitride (SiON) and ii) having different nitride (N) concentrations, wherein the regions of each of the spacers include a first nitride region disposed adjacent to a corresponding one of the common source plugs, a second nitride region surrounding the first nitride region, and a third nitride region surrounding the second nitride region, wherein the second nitride region includes a first bottom region disposed under the first nitride region, and a first side wall region disposed over the first bottom region and surrounding the first nitride region, and wherein the third nitride region includes a second bottom region disposed under the first bottom region of the second nitride region, and a second side wall region over the second bottom region and surrounding the first side wall region of the second nitride region, wherein the first nitride region has a nitride (N) concentration of b (%) to a (%) (a>b), wherein the second nitride region has a nitride (N) concentration of c (%) to b (%) (b>c), and wherein the third nitride region has a nitride (N) concentration of d (%) to c (%) (c>d).

17. The semiconductor device according to claim 16, wherein all of the first nitride region, the second nitride region and the third nitride region contact the corresponding common source plug.

\* \* \* \* \*